United States Patent
Weyant et al.

(10) Patent No.: US 11,262,093 B2
(45) Date of Patent: Mar. 1, 2022

(54) METHOD OF INTELLIGENT DEMAND RESPONSE

(71) Applicant: Insight Energy Ventures, LLC, Royal Oak, MI (US)

(72) Inventors: Rob Weyant, Ann Arbor, MI (US); Kevin M. Foreman, Troy, MI (US); Matthew P. Tilchen, Royal Oak, MI (US); Dave Childers, Durham, NC (US)

(73) Assignee: Insight Energy Ventures, LLC, Royal Oak, MI (US)

( * ) Notice: Subject to any disclaimer, the term of this patent is extended or adjusted under 35 U.S.C. 154(b) by 51 days.

(21) Appl. No.: 16/345,334

(22) PCT Filed: Oct. 27, 2017

(86) PCT No.: PCT/US2017/058823
§ 371 (c)(1),
(2) Date: Apr. 26, 2019

(87) PCT Pub. No.: WO2018/081606
PCT Pub. Date: May 3, 2018

(65) Prior Publication Data
US 2019/0249895 A1 Aug. 15, 2019

Related U.S. Application Data

(60) Provisional application No. 62/470,662, filed on Mar. 13, 2017, provisional application No. 62/414,525, filed on Oct. 28, 2016.

(51) Int. Cl.
*G05B 15/02* (2006.01)
*F24F 11/47* (2018.01)
(Continued)

(52) U.S. Cl.
CPC .............. *F24F 11/47* (2018.01); *G01R 21/00* (2013.01); *G01R 22/063* (2013.01); *G05B 15/02* (2013.01);
(Continued)

(58) Field of Classification Search
None
See application file for complete search history.

(56) References Cited

U.S. PATENT DOCUMENTS 9,152,737 B1 10/2015 Micali et al.
9,344,777 B2 5/2016 He et al.
(Continued)

FOREIGN PATENT DOCUMENTS

EP 2671178 A2 12/2013
WO 2003084022 A1 10/2003
(Continued)

OTHER PUBLICATIONS

Supplementary European Search Report for Application No. EP17864373 dated Apr. 2, 2020, 3 pages.
(Continued)

*Primary Examiner* — Ryan A Jarrett
(74) *Attorney, Agent, or Firm* — Howard & Howard Attorneys PLLC

(57) ABSTRACT

A method of adjusting an energy usage of a usage area including a step of providing a gateway device for the usage area wherein the usage area comprises at least one electrically powered device and a step of determining an energy usage of the at least one electrically powered device. The method also includes a step of creating a user energy profile and a step of adjusting the energy usage of the at least one electrically powered device in the usage area based on the energy usage of the at least one electrically powered device and based on the user energy profile.

18 Claims, 17 Drawing Sheets

(51) Int. Cl.

| | | |
|---|---|---|
| *H02J 13/00* | (2006.01) | |
| *G06Q 50/06* | (2012.01) | |
| *G06Q 10/06* | (2012.01) | |
| *H02J 3/14* | (2006.01) | |
| *G16Z 99/00* | (2019.01) | |
| *G01R 22/06* | (2006.01) | |
| *G01R 21/00* | (2006.01) | |

(52) U.S. Cl.
CPC ..... *G06Q 10/063* (2013.01); *G06Q 10/06315* (2013.01); *G06Q 50/06* (2013.01); *G16Z 99/00* (2019.02); *H02J 3/14* (2013.01); *H02J 13/0006* (2013.01); *H02J 2310/14* (2020.01); *Y02B 70/30* (2013.01); *Y02B 70/3225* (2013.01); *Y04S 20/222* (2013.01); *Y04S 20/242* (2013.01)

(56) References Cited

U.S. PATENT DOCUMENTS

| | | |
|---|---|---|
| 10,242,219 B2 | 3/2019 | Struttmann |
| 2004/0078153 A1 | 4/2004 | Bartone et al. |
| 2011/0302125 A1 | 12/2011 | Shetty et al. |
| 2012/0053739 A1 | 3/2012 | Brian et al. |
| 2012/0064923 A1 | 3/2012 | Imes et al. |
| 2012/0265357 A1 | 10/2012 | Song et al. |
| 2013/0110621 A1 | 5/2013 | Gupta et al. |
| 2013/0245849 A1 | 9/2013 | Paul et al. |
| 2014/0277795 A1 | 9/2014 | Matsuoka et al. |
| 2014/0278164 A1 | 9/2014 | Wisniewski et al. |
| 2014/0278176 A1 | 9/2014 | Wisniewski et al. |
| 2014/0278177 A1 | 9/2014 | Nguyen et al. |
| 2014/0316595 A1 | 10/2014 | Kayton et al. |
| 2014/0371921 A1* | 12/2014 | Weaver ............... H04L 12/2827 700/276 |
| 2015/0012233 A1 | 1/2015 | Mizuta et al. |
| 2015/0048679 A1 | 2/2015 | Kotowski et al. |
| 2015/0102940 A1 | 4/2015 | Keech et al. |
| 2016/0149411 A1 | 5/2016 | Neyhart |
| 2016/0212506 A1 | 7/2016 | Norwood et al. |
| 2016/0255420 A1 | 9/2016 | McCleland et al. |
| 2018/0364666 A1* | 12/2018 | Haghighat-Kashani .................... H04L 67/30 |
| 2019/0271566 A1 | 9/2019 | Childers et al. |

FOREIGN PATENT DOCUMENTS

| | | |
|---|---|---|
| WO | 2011/002735 A1 | 1/2011 |
| WO | 2012/103138 A1 | 8/2012 |
| WO | 2015192174 A1 | 12/2015 |

OTHER PUBLICATIONS

International Search Report for Application No. PCT/US2017/058795 dated Jan. 4, 2018, 2 pages.

International Search Report for Application No. PCT/US2017/058823 dated Jan. 8, 2018, 3 pages.

Supplementary European Search Report for Application No. EP17863711 dated May 6, 2020, 2 pages.

* cited by examiner

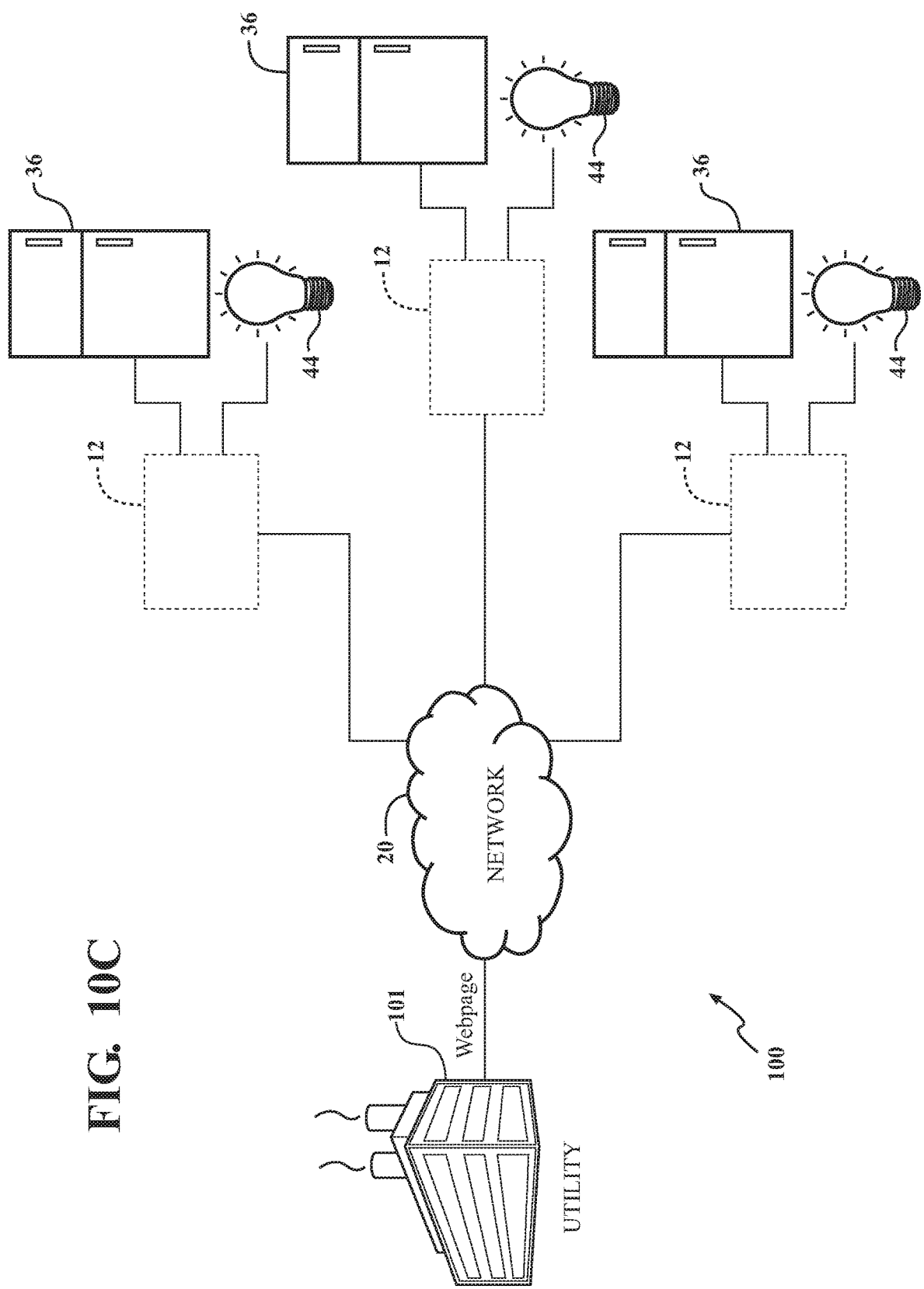

140
METHOD OF INTELLIGENT DEMAND RESPONSE

CROSS-REFERENCE TO RELATED APPLICATIONS

The present application is the National Stage of International Patent Application No. PCT/US2017/058823, filed Oct. 27, 2017, which claims priority to and all the benefits of U.S. Provisional Application No. 62/470,662, filed Mar. 13, 2017, and U.S. Provisional Application No. 62/414,525, filed Oct. 28, 2016, the disclosures of which are expressly incorporated herein by reference in their entirety.

TECHNICAL FIELD

The present invention relates generally to an energy usage of a usage area and, more particularly, to a method of controlling the energy usage of the usage area using intelligent demand response.

BACKGROUND OF THE INVENTION

As the initiative to "go green" continues to grow, many companies are discovering new ways to cut energy costs and become more environmentally friendly. For instance, energy conscious utility companies are able to limit energy usage during times of peak demand using demand response systems. During times of peak energy demand, utility companies compensate for the higher demand for energy by using less efficient energy sources to generate energy. These energy sources are less environmentally friendly and more expensive. Demand response systems allow utility companies to incentivize their customers to limit their electrical usage during these times of peak demand.

The purpose of a demand response system is to allow an energy provider, e.g., a utility company, to impose incentivized load shedding on their customers. For customers that opt-in to an energy provider's demand response system, the energy provider can turn off the customer's non-essential energy usage devices during times of peak demand.

Customers are incentivized by their energy savings and monetary rewards utility companies typically offer for participation.

However, while demand response systems are generally able to allow utility companies to control the energy usage of a customer, certain disadvantages remain. For example, there remains a need in the art for utility companies to utilize demand response in a more intelligent and accurate manner, to provide demand response information in a quick and accessible manner, and to control more of the customer's energy usage devices.

As such, there are opportunities to address at least the aforementioned problems.

SUMMARY OF THE INVENTION

The present invention provides a method for adjusting an energy usage of one or more usage areas, e.g., buildings, homes, etc. The method includes a step of providing a gateway device for the usage area wherein the usage area includes at least one electrically powered device and determining an energy usage of the at least one electrically powered device. The method also includes a step of creating a user energy profile and a step of adjusting the energy usage of the at least one electrically powered device in the usage area based on the energy usage of the at least one electrically powered device in the usage area and based on the user energy profile.

Advantageously, the method allows a user to manage energy use, e.g., to reduce energy use in a usage area in a more intelligent and accurate manner. The method also allows an energy provider to reduce the energy use of a plurality of the at least one electrically powered devices in a plurality of the usage areas in peak demand times, and then increase energy use of a plurality of the at least one electrically powered devices in a plurality of the usage areas when demand subsides. To this end, utilities may level the energy use of a plurality of usage areas, which reduces stress on energy production and infrastructure.

Other features and advantages of the present invention will be readily appreciated as the same becomes better understood by reference to the following detailed description when considered in connection with the accompanying drawings.

BRIEF DESCRIPTION OF THE DRAWINGS

FIGS. 10B and 10C are diagrammatic views of a system for adjusting an energy usage of a usage area.

Figure 1:
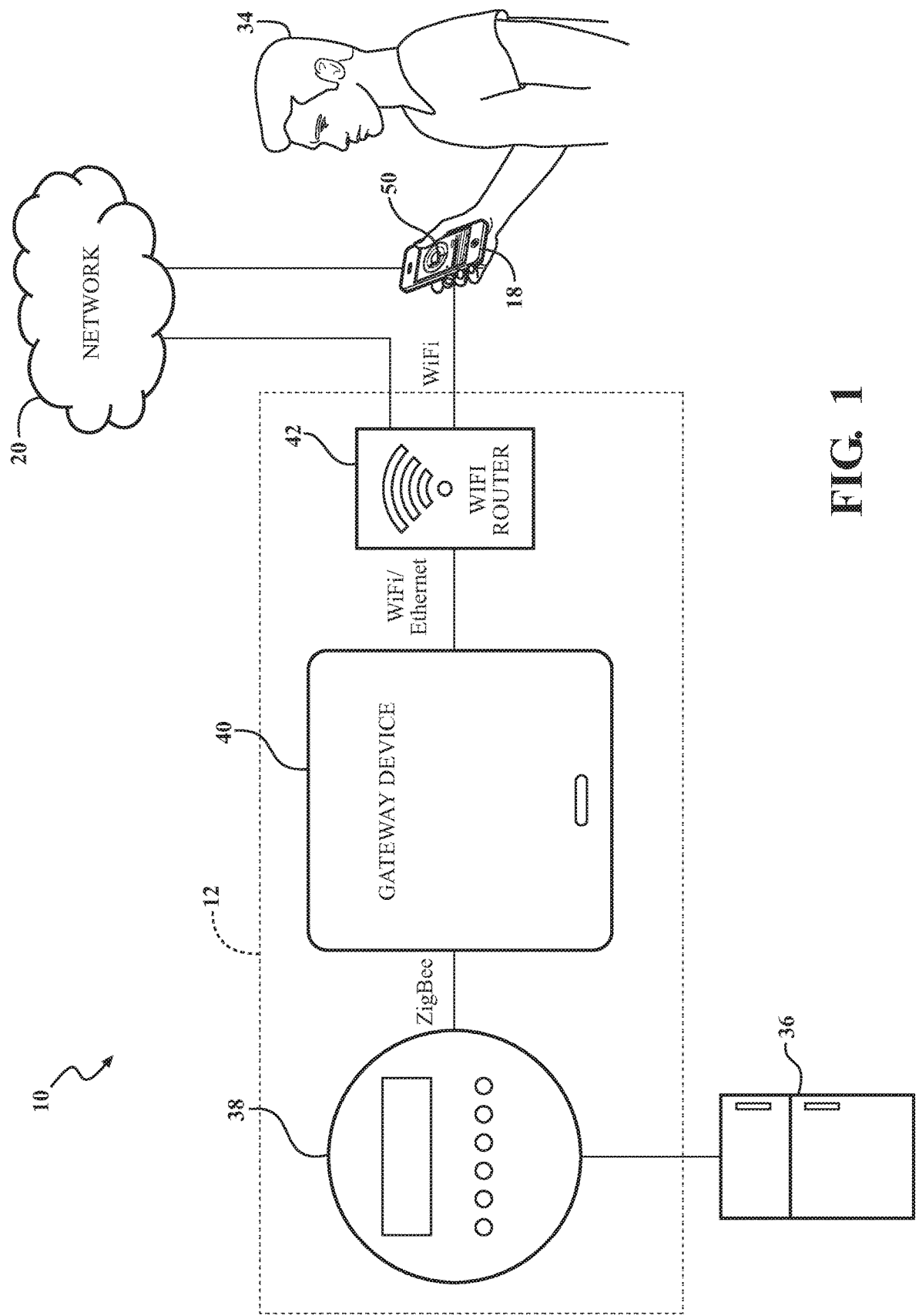
FIG. 1 is a diagrammatic view of one embodiment of a system for disaggregating an aggregate energy usage signal of a usage area.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention. Also, common but well-understood elements that are useful or necessary in commercially feasible embodiments are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is to be appreciated that the figures provided herewith are for explanation purposes to persons ordinarily skilled in the art and that the drawings are not necessarily drawn to scale.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible media of expression having computer-usable program code embodied in the media.

Any combination of one or more computer-usable or computer-readable media (or medium) may be utilized. For example, computer-readable media may include one or more of a portable computer diskette, a hard disc drive, a random-access memory (RAM) device, a non-volatile random-access memory (NVRAM) device, a read-only memory (ROM) device, an erasable programmable read-only memory (EPROM or flash memory) device, a portable compact disc read-only memory (CDROM) device, an optical storage device, and a magnetic storage device. Computer program code for carrying out operations of the present invention may be written in any combination of one or more programming languages.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that may be rapidly provisioned via virtualization and released with minimal management effort or service provider interaction, and then scaled accordingly. A cloud model may be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS")), and deployment models (e.g., private cloud, community cloud, public cloud, hybrid cloud, etc.).

The flowchart and block diagrams in the flow diagrams illustrate the architecture, functionality, and operation of possible implementations of systems, methods, and computer program products according to various embodiments of the present invention. In this regard, each block in the flowchart or block diagrams may represent a module, segment, or portion of code, which may include one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable media, which may direct a computer or other programmable data processing apparatus to function in a particular manner, such that the instructions stored in the computer-readable media produce an article of manufacture including instruction means, which implement the function/act specified in the flowchart and/or block diagram block or blocks.

Several (or different) elements discussed below, and/or claimed, are described as being "coupled", "in communication with", or "configured to be in communication with". This terminology is intended to be non-limiting and, where appropriate, interpreted to include without limitation, wired and wireless communication using any one or a plurality of a suitable protocols, as well as communication methods that are constantly maintained, are made on a periodic basis, and/or made or initiated on an as needed basis.

I. System Overview

Referring to the figures, wherein like numerals indicate like or corresponding parts throughout the several views, a system 10 is provided in FIG. 1. The system 10 includes an energy usage platform 12 that is installed in a usage area, e.g. a home (not shown). It should be appreciated that the energy usage platform 12 provides an energy usage signal corresponding to an energy usage of the usage area to a user 34. As shown, the energy usage platform 12 may include a gateway device 40. The gateway device 40 may be connected to an energy measurement device 38, which may measure the energy usage of the usage area or the energy usage of an electrically powered device 36 (illustrated as a refrigerator in FIG. 1). The energy measurement device 38 may then provide the energy usage to the gateway device 40. Furthermore, the gateway device 40 may be connected to a network 20 and a user computing device 18 using a WiFi router 42. As such, the gateway device 40 may provide the energy usage of the usage area to the user 34 via a user application 50.

The usage area as referred to herein may be defined as any area that utilizes energy. A building is an example of the usage area. Example usage areas include, but are not limited to homes, factories, office buildings, restaurants, hospitals, and apartment complexes. In some embodiments of this invention, the usage area may also be defined as wings or floors of buildings, such as a wing or floor of any of the example usage areas listed above. The words "usage area" and "home" may be used interchangeably herein, and should thus not be construed as limiting.

The user 34 as referred to herein may be defined as any individual or individuals who occupy and/or use the usage area or any individual or individuals who manage and/or control energy usage within the usage area. Some suitable, non-limiting examples of the user 34 are residents and employees who utilize usage areas such as homes and workplaces. As a residential example, the user 34 may be a homeowner or family member of the homeowner who resides in a home. As another example, the user 34 may be a family of five residents who reside in a home. As workplace examples, the user 34 may be a maintenance manager in a factory, an office manager in an office building, or a department manager in a hospital (i.e., a usage area). As yet another example, the user 34 may be a business owner/restaurateur who owns a restaurant. Other suitable, non-limiting examples of the user 34 are individuals who manage the usage area and the activities and/or energy usage therein, but who are not regularly in the usage area. For example, the user 34 may be a maintenance technician of an apartment complex.

Figure 2:
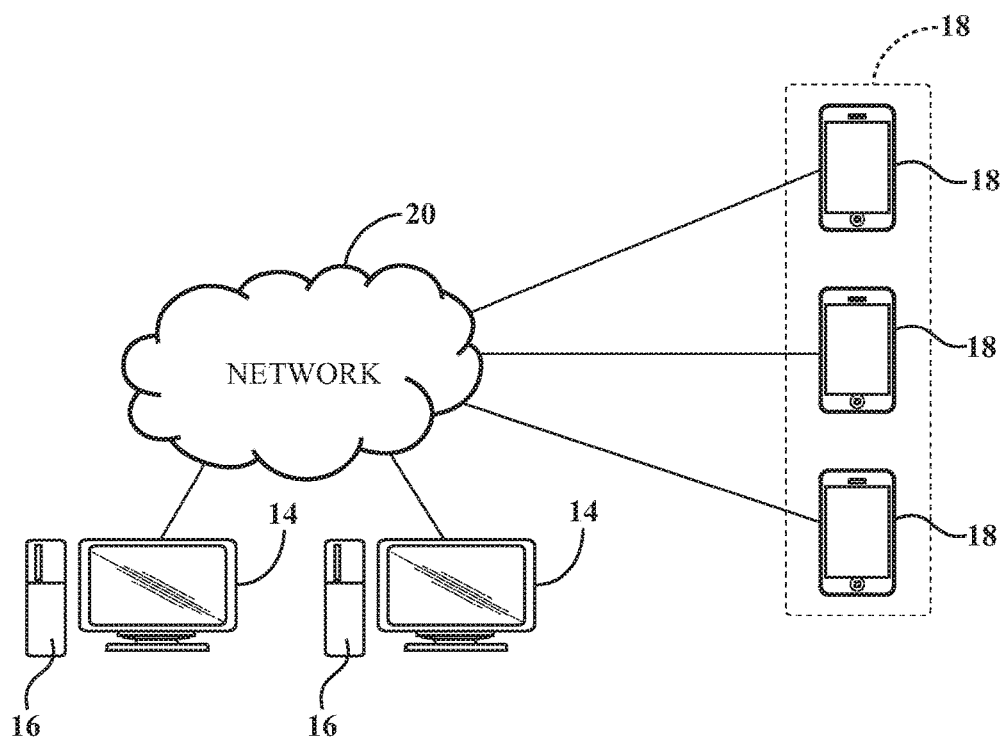
FIG. 2 is another diagrammatic view of the system of FIG. 1.

Referring to FIG. 2, the system 10 may include one or more server systems 14 that may each be embodied as one or more server computers 16, each including one or more processors that are in data communication with one another. The server system 14 may be in data communication with one or more user computing devices 18. In the system 10 and method disclosed herein, the user computing devices 18 may be embodied as desktop computers, mobile phones, tablet computers, wearable devices, laptops, or any other suitable computing devices. For example, in FIG. 2, the user computing devices 18 are illustrated as mobile phones. Furthermore, it should be appreciated that the user computing devices 18 may be a portable digital power analyzer as disclosed in U.S. Patent Application Publication No. US20140278164A1, the entire disclosure of which is expressly incorporated by reference. It should also be appreciated that a portable digital power analyzer determines an electrical power parameter of an adjacent electrical wire and includes a magnetometer, a display, and a processor. In one configuration, the portable digital power analyzer may be a mobile phone and may include a wireless radio configured to facilitate communication with a cellular network. In one configuration, the portable digital power analyzer may be internet-enabled and the wireless radio may facilitate communication with the internet.

For clarity in discussing the various functions of the system 10, multiple computers and/or servers are discussed as performing different functions. These different computers (or servers) may, however, be implemented in multiple different ways such as modules within a single computer, as nodes of a computer system, etc. The functions as performed by the system 10 (or nodes or modules) may be centralized or distributed in any suitable manner across the system 10 and its components, regardless of the location of specific hardware. Furthermore, specific components of the system 10 may be referenced using functional terminology in their names. The functional terminology is used solely for purposes of naming convention and to distinguish one element from another in the following discussion. Unless otherwise specified, the name of an element conveys no specific functionality to the element or component.

Some or all of the server systems 14, servers, or server computers 16 and customer devices or user computing devices 18 may communicate with one another by means of the network 20. The network 20 may be embodied as a peer-to-peer connection between devices, a local area network (LAN), a WiFi network, a Bluetooth network, the Internet, a cellular network, a radio wave connection, an Infrared connection, or any other communication medium or system. Each of the server systems 14 or server computers 16 may be coupled to one another by separate networks, or some or all of the server systems 14 or server computers 16 may share a common network. For example, in some embodiments, the server systems 14 or server computers 16 may communicate over a separate private network, rather than over the network 20.

Figure 3:
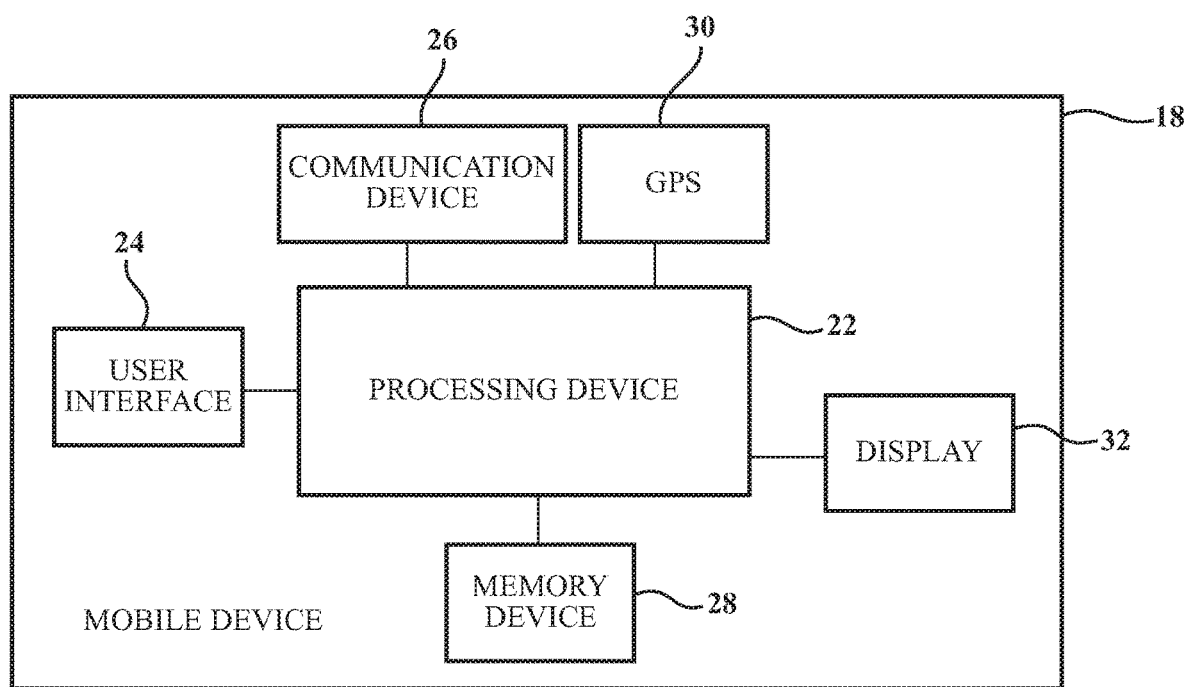
FIG. 3 is a diagrammatic view of a user computing device used with the system of FIG. 1.

FIG. 3 provides a diagrammatic view of the user computing device 18 of FIG. 1. In FIG. 3, the user computing device 18 includes a processing device 22, a user interface 24, a communication device 26, a memory device 28, a global positioning system (GPS) 30, and a display 32. It should be appreciated that the user computing device 18 may include other components, and the above components are not required.

The processing device 22 may be configured to execute processor-executable instructions. The processor-executable instructions may be stored in a memory of the processing device 22, which may include a random-access memory (RAM) device, a non-volatile random-access memory (NVRAM) device, a read-only memory (ROM) device, an erasable programmable read-only memory (EPROM or Flash memory) device, a hard disc drive, a portable computer diskette, an optical disc drive, and/or a magnetic storage device. The processing device 22 may also include one or more processors for executing the processor-executable instructions. In embodiments where the processing device 22 includes two or more processors, the processors may operate in a parallel or distributed manner. The processing device 22 may execute the operating system of the user computing device 18.

The communication device 26 is a device that allows the user computing device 18 to communicate with another device. For example, the communication device 26 may allow the communication device 26 to communicate with the server system 14, the one or more server computers 16, or any other user computing device 18 via the network 20. The communication device 26 may include one or more wireless transceivers for performing wireless communication and/or one or more communication ports for performing wired communication.

The memory device 28 is a device that stores data generated or received by the user computing device 18. The memory device 28 may include, but is not limited to, a random-access memory (RAM) device, a non-volatile random-access memory (NVRAM) device, a read-only memory (ROM) device, an erasable programmable read-only memory (EPROM or flash memory) device, a hard disc drive, a portable computer diskette, an optical disc drive, and/or a magnetic storage device.

The user interface 24 is a device that allows a user to interact with the user computing device 18. While one user interface 24 is shown, the term "user interface" may include, but is not limited to, a touch screen, a physical keyboard, a mouse, a microphone, and/or a speaker. The user computing device 18 may also include a display 32 for displaying information and visuals to the user. In an example embodiment, the user computing device 18 may include a user application and/or a graphical user interface (GUI). The user application and/or the GUI may display information to the user via the display 18 and may receive inputs from the user via the user interface 24.

The GPS 30 is a device that determines a location of the user computing device 18 by communicating with a plurality of GPS satellites. The GPS 30 may perform known triangulation techniques to determine the GPS coordinates of the user computing device 18. It should be appreciated that, while a GPS 30 is shown, any other suitable component for determining the location of the user computing device 18 may be implemented.

II. Energy Usage Platform Overview

In the embodiment of the energy usage platform 12 shown in FIG. 1, the user 34 may view energy usage information of the electrically powered device 36 of interest such as an appliance, furnace, HVAC, etc., in the usage area. In FIG. 1, the electrically powered device 36 is illustrated as a refrigerator of the usage area. However, in other embodiments, the electrically powered device 36 may be any device that is powered by electricity in the usage area. Furthermore, the electrically powered device 36 may be a plurality of electrically powered devices 36. As shown in FIG. 1, the energy usage platform 12 may include the energy measurement device 38, which may measure the energy usage information of the electrically powered devices 36 and/or the energy usage information of the entire usage area. For example, in the embodiment shown in FIG. 1, the energy measurement device 38 may be an energy meter. In some embodiments, the energy meter may be an electromechanical induction type energy meter, an analog electronic energy meter, a digital electronic energy meter, or a smart energy meter. In the embodiment shown in FIG. 1, the energy meter is a smart energy meter, which may be capable of measuring the amount of electric energy consumed by the electrically powered device 36 as well as transmitting the energy usage information digitally. Furthermore, the electrically powered device 36 may be provided by an energy provider, such as a utility company.

In other embodiments, the energy measurement device 38 may include other suitable means of obtaining an energy reading in a usage area. For example, the energy measurement device 38 may include strategically placed sensors for measuring an amount of electric energy consumed by one or more electrically powered devices 36 or the entire usage area. In one such embodiment, the energy measurement device 38 may include a contactless sensor, such as a Hall effect sensor, to conveniently measure electrical current flowing to the electrically powered device 36.

Additionally, the energy usage platform 12 may include a gateway device 40. The gateway device 40 employs a combination of custom hardware and custom software to connect the user computing device 18 of the user 34 with the energy measurement device 38. Depending on the type of energy measurement device 38, various methods of communication may be employed by the gateway device 40. For example, in the embodiment shown in FIG. 1, the energy measurement device 38 is a smart energy meter, which may be capable of transmitting the energy usage information digitally. As such, the gateway device 40 may connect to the energy measurement device 38 and exchange the energy usage information using a standardized communication protocol. For example, in the embodiment shown in FIG. 1, the gateway device 40 connects to the energy measurement device 38 and receives the energy usage information by using ZigBee Smart Energy as the communication protocol. It should be appreciated that the gateway device 40 may use any suitable communication protocol to exchange data. For example, the gateway device 40 may also use WiFi, Bluetooth, Thread, Z-Wave, a cellular signal, or any other suitable communication protocol to communicate with the energy measurement device 38.

The gateway device 40 may also transmit the energy usage information measured by the energy measurement device 38 to the user computing device 18 of the user 34 for display. In the embodiment of FIG. 1, the user computing device 18 may include the user application 50 for displaying the energy usage information to the user 34. In such embodiments, the user application 50 may be installed onto the user computing device 18 and may serve as a primary end user touchpoint for the energy usage platform 12.

To transmit the energy usage information to the user computing device 18, the gateway device 40 may connect to the user computing device 18 using any communication protocol suitable for transferring data to the user computing device 18. For example, in the embodiment shown in FIG. 1, the gateway device 40 may connect to the WiFi router 42 using a WiFi or Ethernet signal and the user computing device 18 may connect to the WiFi router 42 using a WiFi signal to complete the connection. In such embodiments, the WiFi router 42 may be integral to or separate from the gateway device 40. Furthermore, the gateway device 40 may connect to the user computing device 18 using at least one of Bluetooth, Thread, Z-Wave, ZigBee Smart Energy, USB, a cellular signal, or any other suitable communication protocol.

Figure 4:
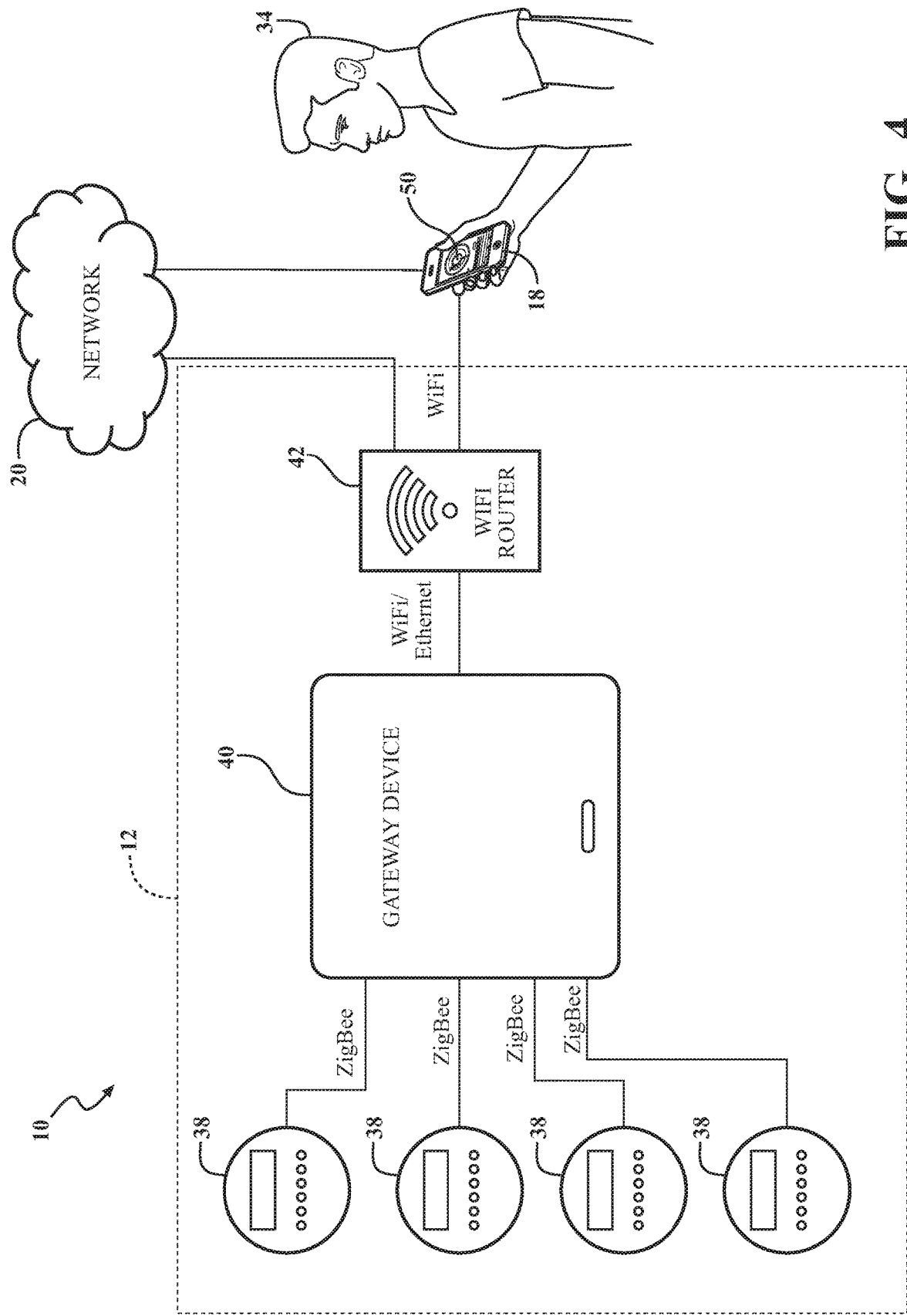
FIG. 4 is a diagrammatic view of another embodiment of the system for disaggregating the aggregate energy usage signal of the usage area.

Referring to FIG. 4, the user computing device 18 may be simultaneously connected to a plurality of energy measurement devices 38 via the gateway device 40; for example, in the case of an apartment complex, a factory, or any other such usage areas including the plurality energy measurement devices 38. As such, the gateway device 40 may simultaneously receive and transmit energy usage information from the plurality of energy measurement devices 38 to the user computing device 18. As shown FIG. 4, the gateway device 40 may be connected to the plurality of energy measurement devices 38 using a suitable communication protocol. In FIG. 4, the plurality of energy measurement devices 38 are illustrated as smart energy meters and the communication protocol is illustrated as a ZigBee Smart Energy connection. Of course, the user computing device 18 may be connected to a single energy measurement devices 38 via the gateway device 40; for example, in the case of a home.

Figure 5:
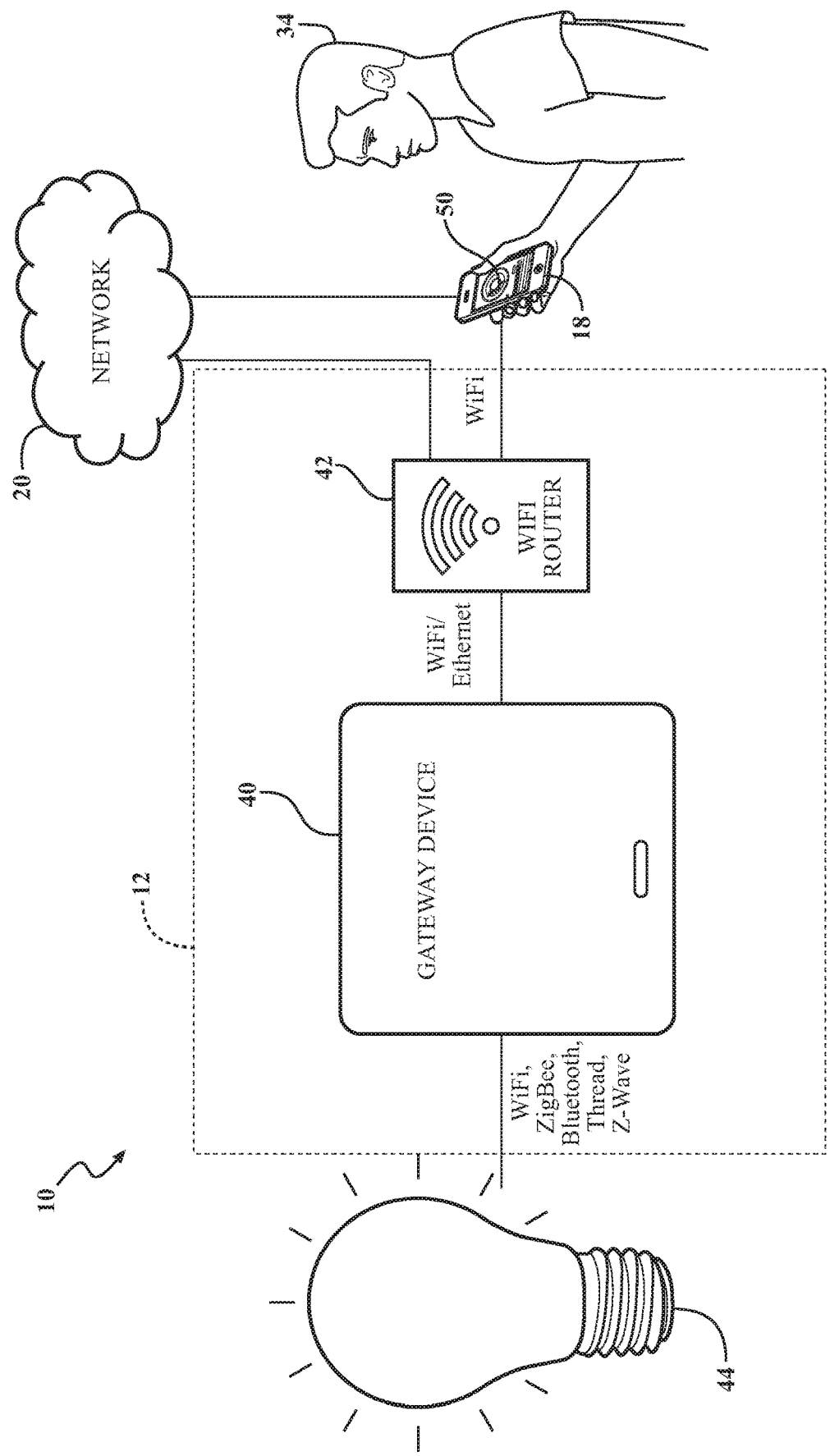
FIG. 5 is a diagrammatic view of yet another embodiment of the system for disaggregating the aggregate energy usage signal of the usage area.

As shown in FIG. 5, the user computing device 18 may be connected to an Internet of Things (IoT) device 44 via the gateway device 40, allowing the user 34 to control an energy usage of the IoT device 44 using the user computing device 18. In FIG. 5, the IoT device 44 is illustrated as a smart lightbulb, which may be turned on, turned off, or dimmed by the user 34 using the user computing device 18. However, it should be noted that the IoT device 44 may be any device capable of being controlled using a communication protocol. For example, the IoT device 44 may be a smart thermostat, a smart ceiling fan, a smart coffee maker, a smart lock, a smart speaker, a smart oven, a smart humidifier, a smart air purifier, a smart home security system, etc. As shown in FIG. 5, the gateway device 40 may be connected to the IoT device 44 using a suitable communication protocol, such as WiFi, ZigBee Smart Energy, Bluetooth, Thread, and/or Z-Wave. In some embodiments, the user 34 may control the IoT device 44 via the user application 50 on the user computing device 18.

Figure 6:
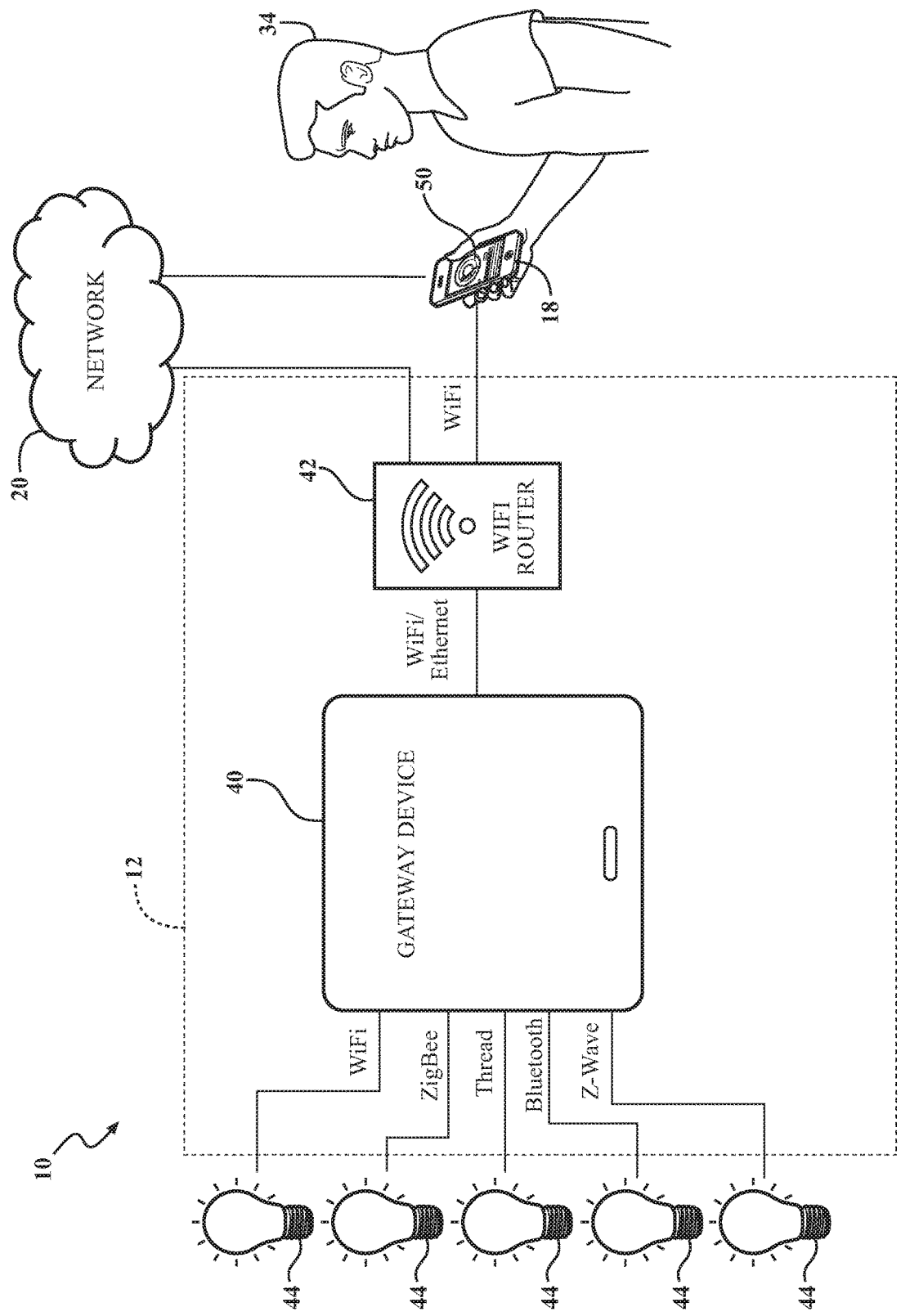
FIG. 6 is a diagrammatic view of a further embodiment of the system for disaggregating the aggregate energy usage signal of the usage area.

In an embodiment shown in FIG. 6, the user computing device 18 may be simultaneously connected to a plurality of IoT devices 44 via the gateway device 40. As such, the user 35 may simultaneously control an energy usage of the plurality of IoT devices 44 using the user computing device 18. As shown in FIG. 6, the gateway device 40 may be connected to the plurality of IoT devices 44 using a suitable communication protocol. In the embodiment shown in FIG. 6, the gateway device 40 connects to each of the plurality of IoT devices 44 using one or more of WiFi, ZigBee Smart Energy, Bluetooth, Thread, or Z-Wave as the communication protocol.

It should be noted that, while the energy measurement devices 38 and the electrically powered devices 36 are omitted from FIG. 5 and FIG. 6, the energy usage platform 12 of FIG. 5 and FIG. 6 may include the energy measurement devices 38 and/or the electrically powered devices 36. Furthermore, in some embodiments, IoT devices 44 may be a subset of the electrically powered devices 36. Therefore, unless specifically noted, the term "electrically powered device(s) 36" may hereinafter be interpreted as including "IoT device(s) 44", and should thus not be construed as limiting.

As such, because the gateway device 40 is able to connect to the plurality of energy measurement devices 38 and to the electrically powered devices 36, the gateway device 40 may act as a centralized hub, allowing the user 34 to monitor and control the energy usage of multiple electrically powered devices 36. In this way, the gateway device 40 may be distinguishable from devices that perform tasks similar to the gateway device 40, but are only capable of allowing the user 34 to monitor and control the energy usage of a single electrically powered device 36. For example, the present invention may be distinguishable from a garage opener that only allows the user 34 to monitor an energy usage of and/or control a garage door. Of course, it is to be noted that the gateway device 40 may be connected to a garage door or a garage door opener and may allow the user 34 to monitor and control the energy usage of the garage door or the garage door opener.

Furthermore, in some embodiments, the gateway device 40 may be structurally separate from the electrically powered devices 36 and the energy measurement devices 38. For example, the gateway device 40 may be a stand-alone device that allows the user 34 to monitor and control the electrically powered devices 36 in the usage area using the user computing device 18. In this way, the present invention may be distinguishable from devices that include a device for performing tasks similar to the gateway device 40, which may not be physically separated from a device performing tasks similar to an electrically powered device 36 while still maintaining its function. For example, the present invention may be distinguishable from an invention wherein a device performing tasks similar to the gateway device 40 may not be separated from a thermostat.

III. User Application Overview

In accordance with the components described, the user application 50 of the user computing device 18 is further described herein wherein different views of the user application 50 are illustrated in FIGS. 7A-7D. The user application 50 serves as the primary end user touchpoint for the energy usage platform 12. As such, the user application 50 may allow the user 34 to control the energy usage of the plurality of IoT devices 44 and view the energy usage information.

Figure 7A:
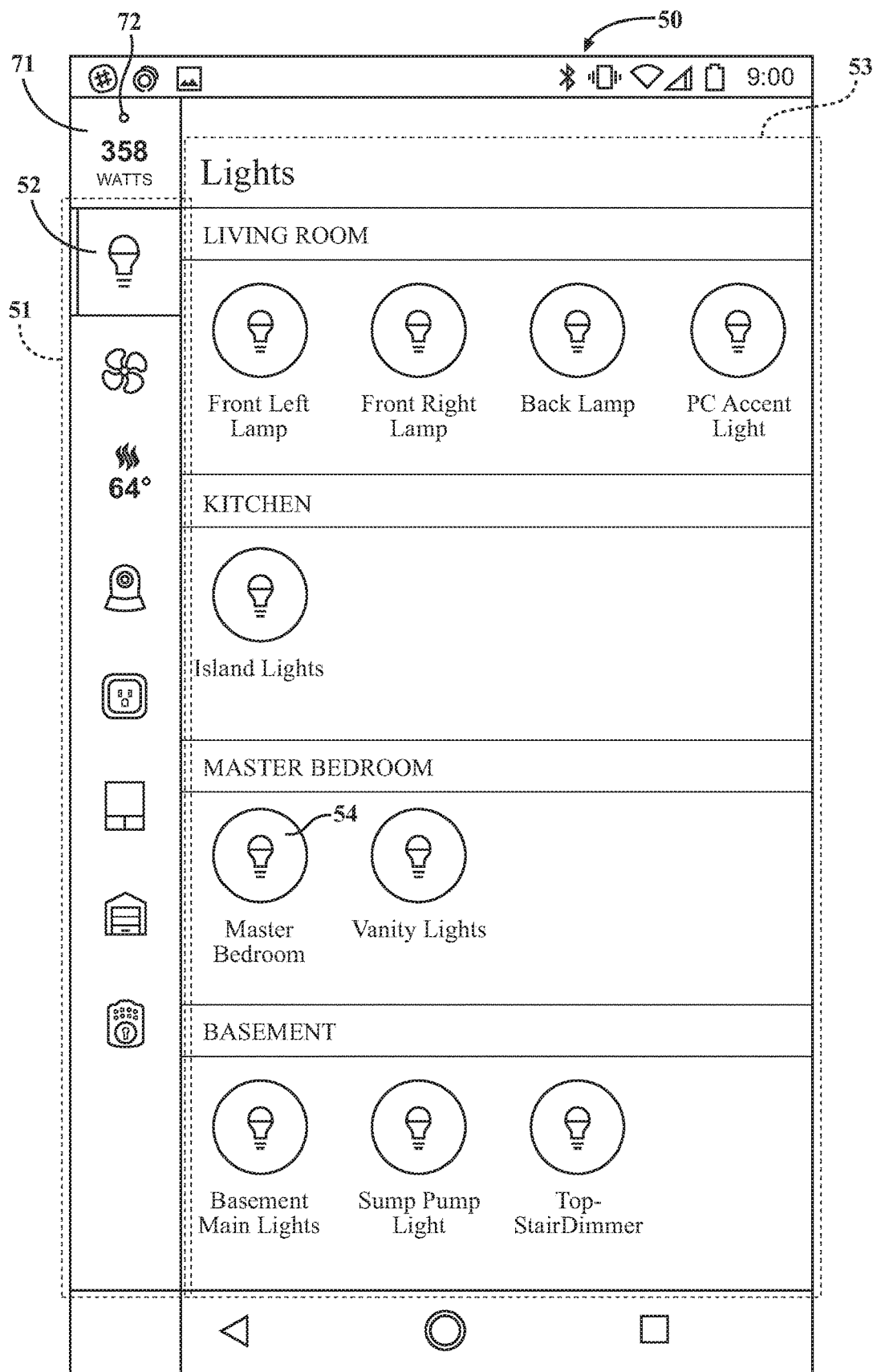
FIGS. 7A, 7B, 7C, and 7D are different views of a user application used in conjunction with the system of FIG. 1.

In FIG. 7A, one view of the user application 50 is illustrated where the user application 50 provides a control dashboard 53 wherein IoT devices 44 are listed and are able to be controlled. In the embodiment shown in FIG. 7A, the user application 50 includes a menu bar 51, which allows the user 34 to select a type of IoT device 44 to control. For example, in FIG. 7A, the user has selected a lightbulb 52 on the menu bar 51. Accordingly, the user application 50 provides the user 34 the control dashboard 53 where the user 34 may control the IoT devices 44 which are lightbulbs. For example, referring to the embodiment of FIG. 7A, if the user 34 presses a lightbulb 54 above "Master Bedroom", the user 34 may turn on, turn off, or dim a lightbulb in the master bedroom of the home.

FIG. 7A also provides the energy usage information via a real-time energy usage 71. The real-time energy usage 71 represents the energy usage of the usage area for a present time on a present day, with a Watts (W) per minute resolution. For example, the real-time energy usage 71 in FIG. 7A is 358 Watts at the time the user 34 is viewing the user application 50, which is 9:00 AM according to the upper right hand corner of FIG. 7A. Furthermore, the user application 50 may include a status monitor 72, which may be illuminated based on whether the energy usage platform 12 is receiving the energy usage of the usage area and/or based on whether the energy usage platform 12 has experienced an error.

Figure 7B:
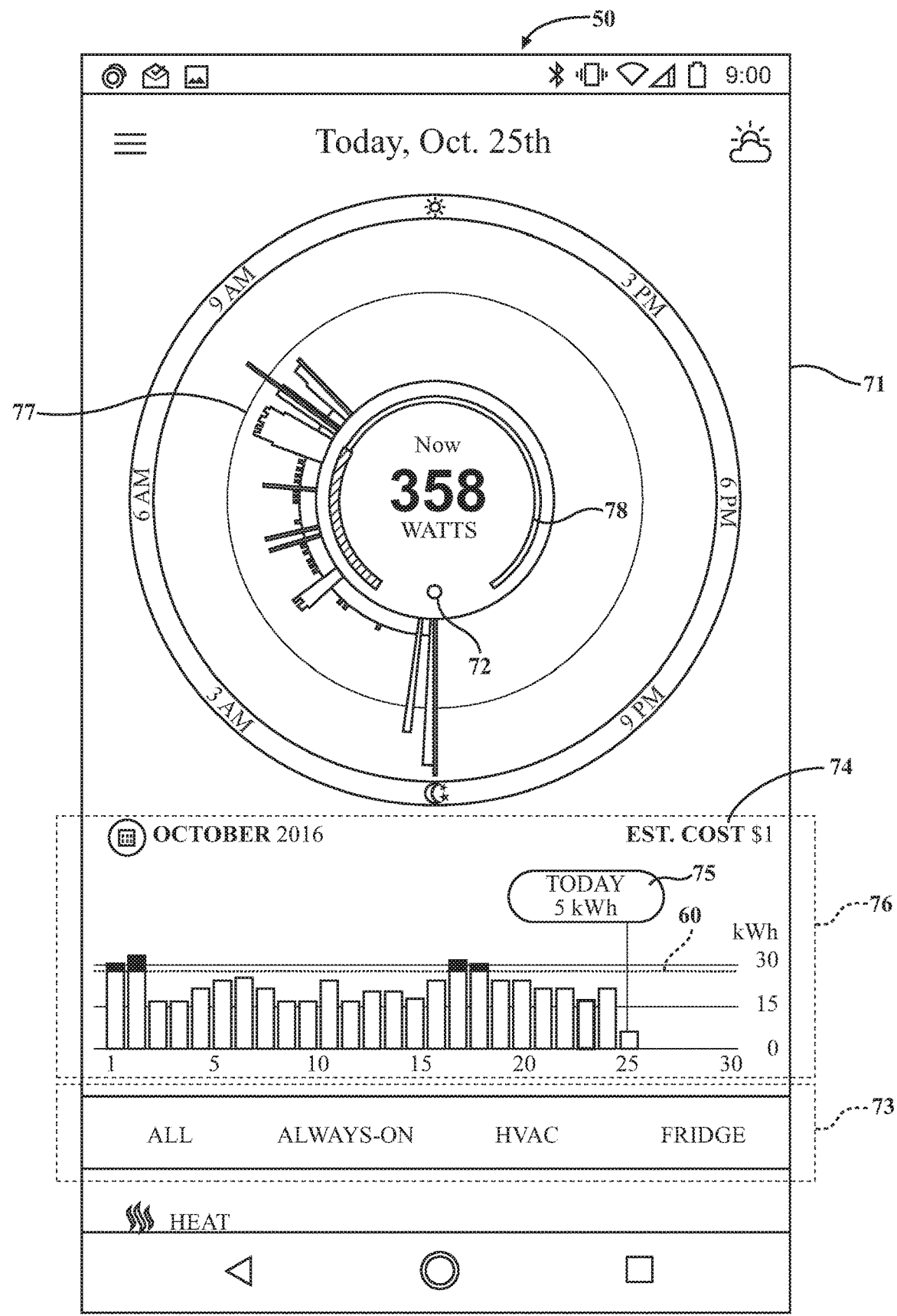

Referring to FIG. 7B, the user application 50 provides another view of the real-time energy usage 71. In FIG. 7B, the user application 50 provides the real-time energy usage 71 and the status monitor 72, as well as a circular bar graph 77 displaying a history of the real-time energy usage 71 for the present day. For example, in FIG. 7B, the real-time energy usage 71 corresponds to 9:00 AM on October $25^{th}$ and the circular bar graph 77 displays a history of the real-time energy usage 71 for the entire day of October $25^{th}$. Additionally, the user application 50 may provide a real-time energy meter 78, which may fill and change color based on the real-time energy usage 71.

Below the circular bar graph 77 is a histogram 76, which provides a cumulative daily energy value 75, in Kilowatt hours (kWh), corresponding to each day in a present month. For example, in FIG. 7B, the histogram 76 provides the cumulative daily energy usage 75 for each day from October $1^{st}$ to October $25^{th}$. For reference, the cumulative daily energy usage 75 for a given day may be determined by summing the real-time energy usage 71 values for the given day. The histogram 76 may also provide a cumulative estimated cost 74 corresponding to the cumulative daily energy usage 75.

Furthermore, the histogram 76 in FIG. 7B may include a target daily energy usage 60, which may correspond to a suggested energy usage per day. In some embodiments, the histogram 76 may indicate that the cumulative daily energy usage 75 has exceeded the target daily energy usage 60 by highlighting an amount of excess energy and/or by providing the amount of excess energy.

Furthermore, the user application 50 in FIG. 7B may provide a menu bar 73, which allows the user 34 to view the real-time energy usage 71 for "ALL" devices, or the real-time energy usage 71 for devices categorized as "ALWAYS-ON", "FRIDGE", or "HVAC". For reference, devices categorized as "ALWAYS-ON" may include a water recirculation pump, a desktop computer, a television, a cable set-top box, a printer, a furnace, or a coffee maker of the usage area. "ALWAYS-ON" may also refer to a baseline load of the usage area. "FRIDGE" corresponds to a refrigerator of the usage area and "HVAC" corresponds to an HVAC system of the usage area. "ALL" corresponds to the energy usage of the entire usage area and includes the devices categorized as "ALWAYS-ON", "FRIDGE", or "HVAC".

While the user application 50 in FIG. 7B illustrates the real-time energy usage 71 for "ALL" devices, if the user 34 chooses to view the real-time energy usage 71 for devices categorized as "ALWAYS-ON", "FRIDGE", or "HVAC", the user application 50 may provide a different view of FIG. 7B. For example, if the user 34 selects "ALWAYS-ON", the user application 50 may provide the real-time energy usage 71 for the devices categorized as "ALWAYS-ON". Additionally, the user application 50 may provide the circular bar graph 77, the histogram 76, the cumulative daily energy value 75, the cumulative estimated cost 74, and the target daily energy usage 60 for the devices categorized as "ALWAYS-ON". Similarly, if the user 34 selects "FRIDGE" or "HVAC", the user application 50 may provide the above information for the refrigerator of the usage area or the HVAC system of the usage area.

Figure 7C:
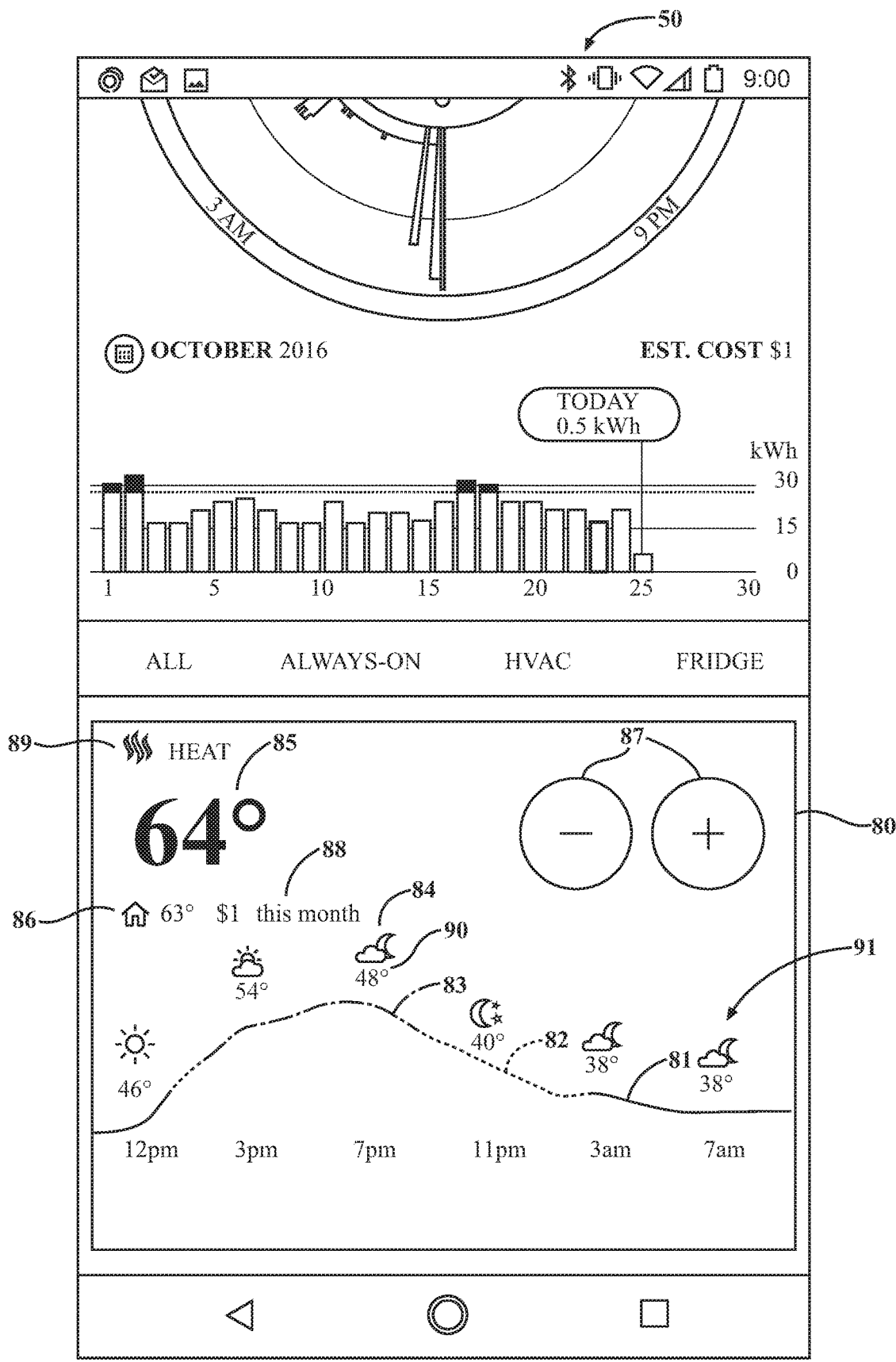

Referring to FIG. 7C, the user application 50 may also provide an HVAC energy summary 80. The HVAC energy summary 80 provides a desired usage area temperature 85, which is adjustable using buttons 87. The desired usage area temperature 85 and the buttons 87 allow the user 34 to set a desired temperature for the usage area. Furthermore, the HVAC energy summary 80 may include an HVAC setting 89, which may correspond to a desired setting of the HVAC system. For example, the HVAC setting 89 in FIG. 7C is set to "HEAT"; accordingly, the HVAC system heats the usage area and ensures that the usage area is at or above the desired usage area temperature 85. In another embodiment, the HVAC setting 89 may be set to "COOL", such that the HVAC system cools the usage area and ensures that the usage area is at or below the desired usage area temperature 85. In yet another embodiment, the HVAC setting 89 may be set to "HEAT/COOL", such that the HVAC system heats or cools the usage area to a preferred temperature range.

The HVAC energy summary 80 may also include a usage area temperature recommendation 86 and an estimated HVAC savings 88. In some embodiments, the estimated HVAC savings 88 may correspond to a monetary savings for the user 34 if the user 34 adjusts the desired usage area temperature 85 to the usage area temperature recommendation 86. The usage area temperature recommendation 86 and the estimated HVAC savings 88 may be calculated based on a temperature of the usage area and/or weather-related data. Furthermore, the HVAC energy summary 80 may also include a temperature graph 91. As shown in FIG. 7C, the temperature graph 91 may provide weather-related data, which may include a forecast 84 and a temperature reading 90. Furthermore, the temperature graph 91 may plot how the temperature of the usage area changes based on the weather, with different types of lines representing when the usage area remains the same temperature, cools, or heats. For example, as shown in FIG. 7C, the solid line 81 in the temperature graph 91 may represent when the usage area cools due to the weather, the dotted line 82 in the temperature graph 91 may represent when the usage area stays the same temperature due to the weather, and the dot-dash line 83 may represent when the usage area heats due to the weather.

Figure 7D:
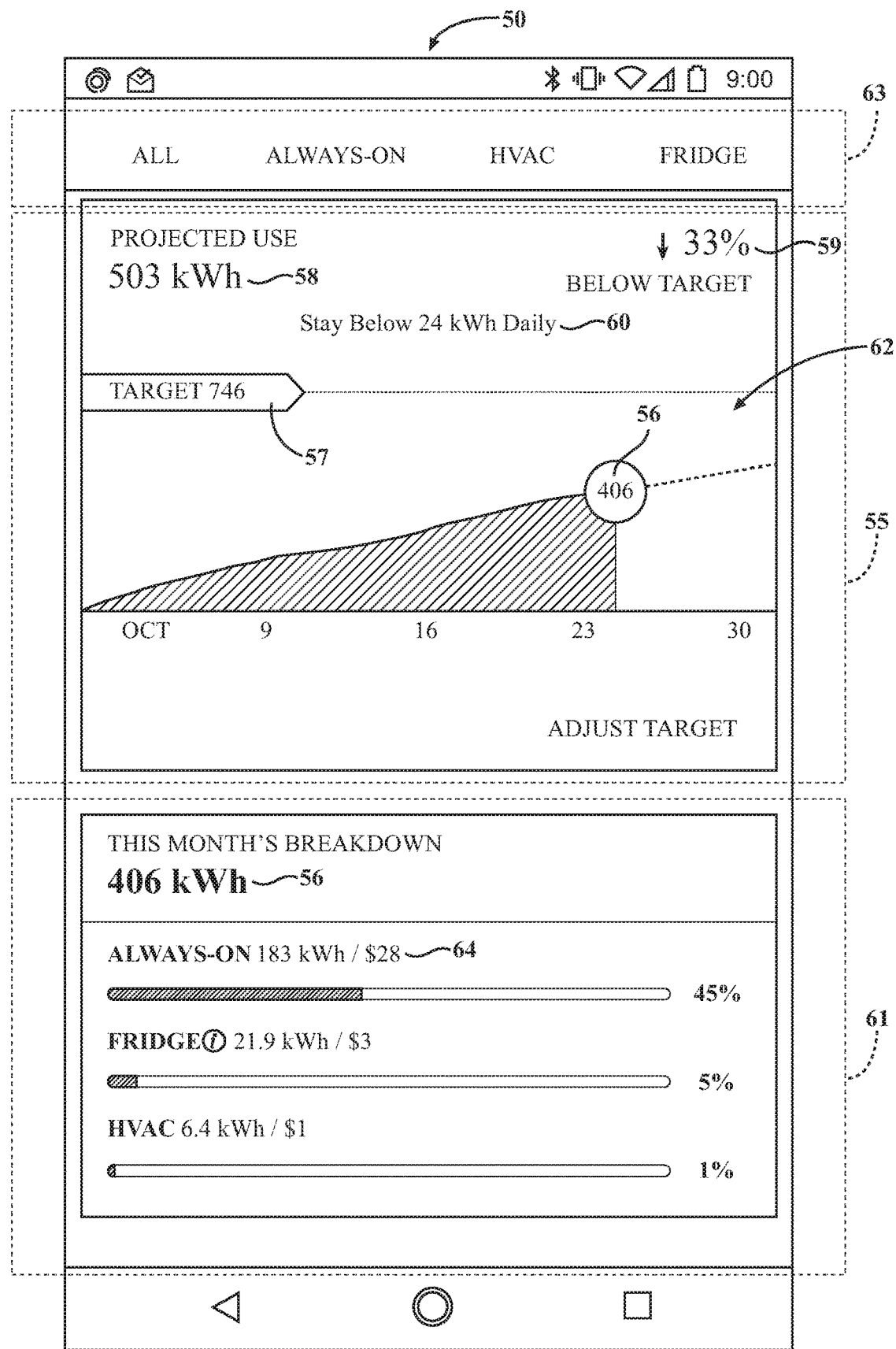

Referring to FIG. 7D, another view of the user application 50 is illustrated where the user application 50 provides the energy usage information via an energy usage summary 55. As shown, the energy usage summary 55 may include an energy usage graph 62 to illustrate energy usage over a period of time. For example, in FIG. 7D, the energy usage graph 62 illustrates the cumulative energy usage and projected energy usage for the month of October, in Kilowatt hours (kWh). Furthermore, the energy usage summary 55 may also provide a cumulative energy usage 56 to date from the beginning of the period of time, a target cumulative energy usage 57 for the entire period of time, a target daily energy usage 60, and a projected cumulative energy usage 58 for the entire period of time. In the embodiment shown in FIG. 7D, the target daily energy usage 60 is 24 kWh; the cumulative energy usage 56 to date from the beginning of October is 406 kWh; the target cumulative energy usage 57 for the entire month of October is 746 kWh; and the projected cumulative energy usage 58 for the entire month of October is 503 kWh.

Furthermore, as shown in FIG. 7D, the energy usage summary 55 may include a projected percentage 59. The projected percentage 59 may represent a percentage of the target cumulative energy usage 57 that is projected to remain unused at the end of the period of time, based on the projected cumulative energy usage 58. Similarly, the projected percentage 59 may represent a percentage of the target cumulative energy usage 57 that the projected cumulative energy usage 58 is projected to exceed at the end of the period of time. As shown in FIG. 7D, the projected percentage 59 indicates that 33% of the target cumulative energy usage 57, 746 kWh, will remain unused at the end of October.

Additionally, it should be noted that the target cumulative energy usage 57 may be adjusted. For example, as shown in FIG. 7D, the energy usage summary 55 includes an "ADJUST TARGET" option. In some embodiments, the user 34 of the user application 50 may select the "ADJUST TARGET" option and adjust the target cumulative energy usage 57. In one embodiment, the energy usage graph 62, the projected percentage 59, and the target daily energy usage 60 may be automatically adjusted after the target cumulative energy usage 57 is adjusted.

Furthermore, the user application 50 in FIG. 7D may provide a menu bar 63, which allows the user 34 to view the energy usage summary 55 for "ALL" devices, or the energy usage summary 55 for the devices categorized as "ALWAYS-ON", "FRIDGE", or "HVAC". While the user application 50 in FIG. 7D illustrates the energy usage summary 55 for "ALL" devices, if the user 34 chooses to view the energy usage summary 55 for the devices categorized as "ALWAYS-ON", "FRIDGE", or "HVAC", the user application 50 may provide a different view of FIG. 7D. For example, if the user 34 selects "ALWAYS-ON", the user application 50 may provide the energy usage summary 55 for the devices categorized as "ALWAYS-ON". Additionally, the user application 50 may provide the energy usage graph 62, the cumulative energy usage 56, the target cumulative energy usage 57, the target daily energy usage 60, and the projected cumulative energy usage 58 for the devices categorized as "ALWAYS-ON". Similarly, if the user 34 selects "FRIDGE" or "HVAC", the user application 50 may provide the above information for the refrigerator of the usage area or the HVAC system of the usage area.

As shown in FIG. 7D, the user application 50 may also include an energy usage breakdown 61. In some embodiments, the energy usage breakdown 61 may illustrate an amount of the cumulative energy usage 56 that is consumed by an electrically powered device 36. For example, as shown in FIG. 7D, the electrically powered devices 36 that are categorized as "ALWAYS-ON" are responsible for 45% of 406 kWh (183 kWh), the cumulative energy usage 56 to date from the beginning of October. Also shown, the refrigerator is responsible for 5%, or 21.9 kWh of the cumulative energy usage 56 and the HVAC system is responsible for 1%, or 6.4 kWh of the cumulative energy usage 56. Furthermore, the energy usage breakdown 61 displays a monetary value 64 coinciding with the "ALWAYS-ON", "FRIDGE", and "HVAC" devices.

Referring to FIG. 7D, another view of the user application 50 is illustrated where the user application 50 provides a visual representation of the energy usage information via an energy usage summary 55. As shown, the energy usage summary 55 may include an energy usage graph 62 to illustrate the energy usage over a period of time. For example, in FIG. 7D, the energy usage graph 62 illustrates a cumulative energy usage and a projected energy usage for a month of October, in Kilowatt hours (kWh). Furthermore, the energy usage summary 55 may also provide a cumulative energy usage 56 to date from the beginning of the period of time, a target cumulative energy usage 57 for the entire period of time, a target daily energy usage 60, and a projected cumulative energy usage 58 for the entire period of time. In the embodiment shown in FIG. 7D, the target daily energy usage 60 is 24 kWh; the cumulative energy usage 56, to date from the beginning of October, is 406 kWh; the target cumulative energy usage 57 for the entire month of October is 746 kWh; and the projected cumulative energy usage 58 for the entire month of October is 503 kWh.

It should be noted that, in other embodiments of the user application 50, the user application 50 may omit any of the features described above or shown in FIGS. 7A-7D or include any other features that may allow the user 34 to control the IoT devices 44 or view the energy usage information.

IV. Method of Disaggregating an Energy Usage Signal

Figure 8:
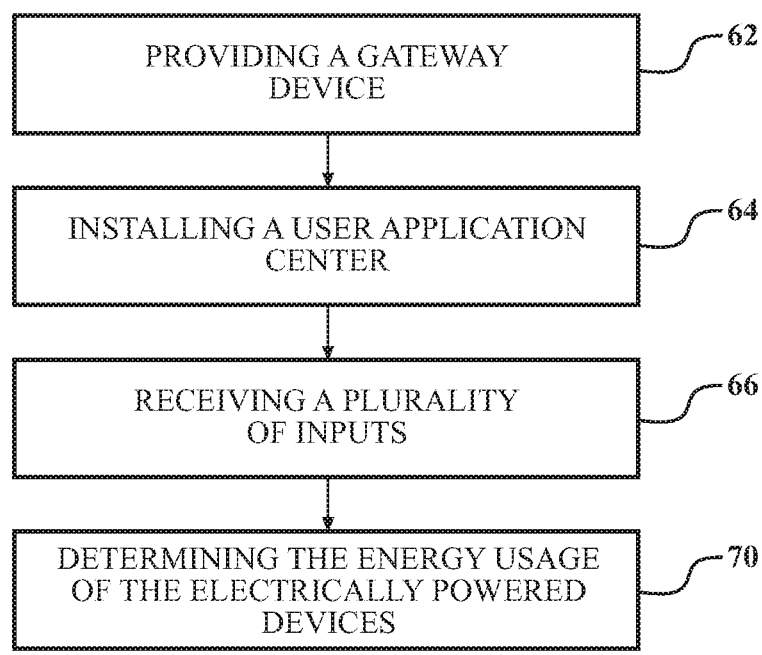
FIG. 8 is a flowchart of a method, according to the present invention, of disaggregating an aggregate energy usage signal of a usage area using the system of FIG. 1.

Referring to FIG. 8, the present invention provides a method of disaggregating an aggregate energy usage signal of the usage area. The aggregate energy usage signal of the usage area reflects an energy usage of the usage area as a whole. As previously stated, the usage area may include electrically powered devices 36. Accordingly, the aggregate energy usage signal of the usage area may include energy usage signals of the electrically powered devices 36. As such, the method of disaggregating the aggregate energy usage signal provides the energy usage signal, and furthermore, the energy usage, of the electrically powered device 36. Similarly, the method of disaggregating may also determine a baseline load of the usage area.

Furthermore, it should be noted that the method of disaggregating the aggregate energy usage signal may be referred to in this section (Section IV) as "the method". Therefore, unless otherwise specified, any references to "the method" in this section refer to the method of disaggregating the aggregate energy usage signal.

As shown in FIG. 8, the method may include a step 102 of providing the gateway device 40 for the energy measurement device 38 of the usage area; a step 104 of installing the user application 50 on the user computing device 18 to display information from the gateway device 40; a step 106 of receiving a plurality of inputs; and a step 108 of determining the energy usage of the electrically powered devices 36 in the usage area based on the aggregate energy usage signal and based on the plurality of inputs.

During step 102, the method provides the gateway device 40, which allows the gateway device to receive the aggregate energy usage signal from the energy measurement device 38 of the usage area. In some embodiments, the gateway device 40 may receive the aggregate energy usage signal at a high frequency or at predetermined time intervals. For example, the gateway device 40 may receive the aggregate energy usage signal at a time interval less than 30 minutes, at a time interval less than 20 minutes, at a time interval less than ten minutes, at a time interval less than 5 minutes, at a time interval less than one minute, at a time interval less than 30 seconds, at a time interval less than 10 seconds, at a time interval less than five seconds, at a time interval less than three seconds, or at a time interval less than one second. In other embodiments, the gateway device 40 may also receive the aggregate energy usage signal as a substantially continuous signal.

During step 104, the user application 50 is installed onto the user computing device 18, allowing the user computing device 18 to display energy usage information from the gateway device 40. In some embodiments, the method may also include a step of providing a server for a network of an energy provider. It should be appreciated that the gateway device 40, the user application 50, and the server may have been previously provided or installed and may be installed in any order.

During step 106, the gateway device 40 and/or the user application 50 installed on the user computing device 18 may receive the plurality of inputs. For example, in some embodiments, the plurality of inputs may include attribute data of the usage area. The attribute data of the usage area may include a number of individuals that live in the usage area, a year the usage area was built, and a square footage of the usage area. In some embodiments, the plurality of inputs may include environment-related metadata. The environment-related metadata may include all weather-related data, such as measurements of temperature, precipitation, humidity, and barometric pressure.

Furthermore, step 106 may include a step of receiving a state of the usage area or a state of the plurality of electrically powered devices 36 from smart devices in the usage area. In such an embodiment, the smart devices may communicate the state of the usage area or the state of the plurality of electrically powered devices 36 to the gateway device 40 and/or user application 50. For example, the smart devices may include, but are not limited to, a thermostat that provides temperature information; a plug-in module that provides energy usage information of an electrically powered device 36; and sensors (such as vibration sensors, light sensors, etc.) coupled to an electrically powered device 36 that may detect and report on/off events of the electrically powered device 36 as they occur.

Additionally, step 106 may include a step of receiving crowd-sourced energy usage information corresponding to an electrically powered device 36. In some embodiments, the gateway device 40 and/or user application 50 may receive the crowd-sourced energy usage information via the network 20. In such embodiments, the gateway device 40 and/or user application 50 may store the crowd-sourced energy usage information and assign the crowd-sourced energy usage information to the electrically powered device 36. The crowd-sourced energy usage information may be stored on the gateway device 40 and/or the user computing device 18.

During step 108, the method may determine the energy usage of the electrically powered devices 36 by applying an algorithm to the aggregate energy usage signal and the plurality of inputs. For example, in one embodiment the method may apply a software-based algorithm to determine an energy usage of the refrigerator. In such an embodiment, the algorithm may take advantage of refrigerator cycle times, which may occur in regular intervals throughout a day. For instance, the method may determine a cycle time of the refrigerator and furthermore, the energy usage of the refrigerator, by analyzing the aggregate energy usage signal for electrically powered devices 36 that cycle on and off in regular intervals. Furthermore, the algorithm may remove activity from the aggregate energy usage signal that occurs at a frequency greater than 0.01 Hz, the minimum plausible duration of most refrigerator cycles, to aid in determining the energy usage of the refrigerator.

It should be noted that the method may determine the energy usage of the electrically powered devices 36 using a hardware-assisted algorithm. For example, in an embodiment where the method uses a hardware-assisted algorithm, the method may utilize timestamp data of on/off events, provided by a sensor. In such an embodiment, the method may determine whether a refrigerator is within the usage area and whether the refrigerator is consuming energy based on timestamp data of on/off events received from a vibration sensor coupled to the refrigerator. Furthermore, the method may use the timestamp data of on/off events to determine the refrigerator cycle times. In some embodiments, the timestamp data of on/off events may allow the method to determine the energy usage of an electrically powered device 36 with more accuracy. For example, the method may occasionally miss or mislabel a refrigerator cycle while analyzing the aggregate energy usage signal using the previously described software-based algorithm. As such, in an embodiment where the method uses a hardware-assisted algorithm, the method may determine the energy usage of the electrically powered device 36 with greater than 70%, greater than 80%, greater than 90%, or greater than 95% accuracy.

Figure 9A:
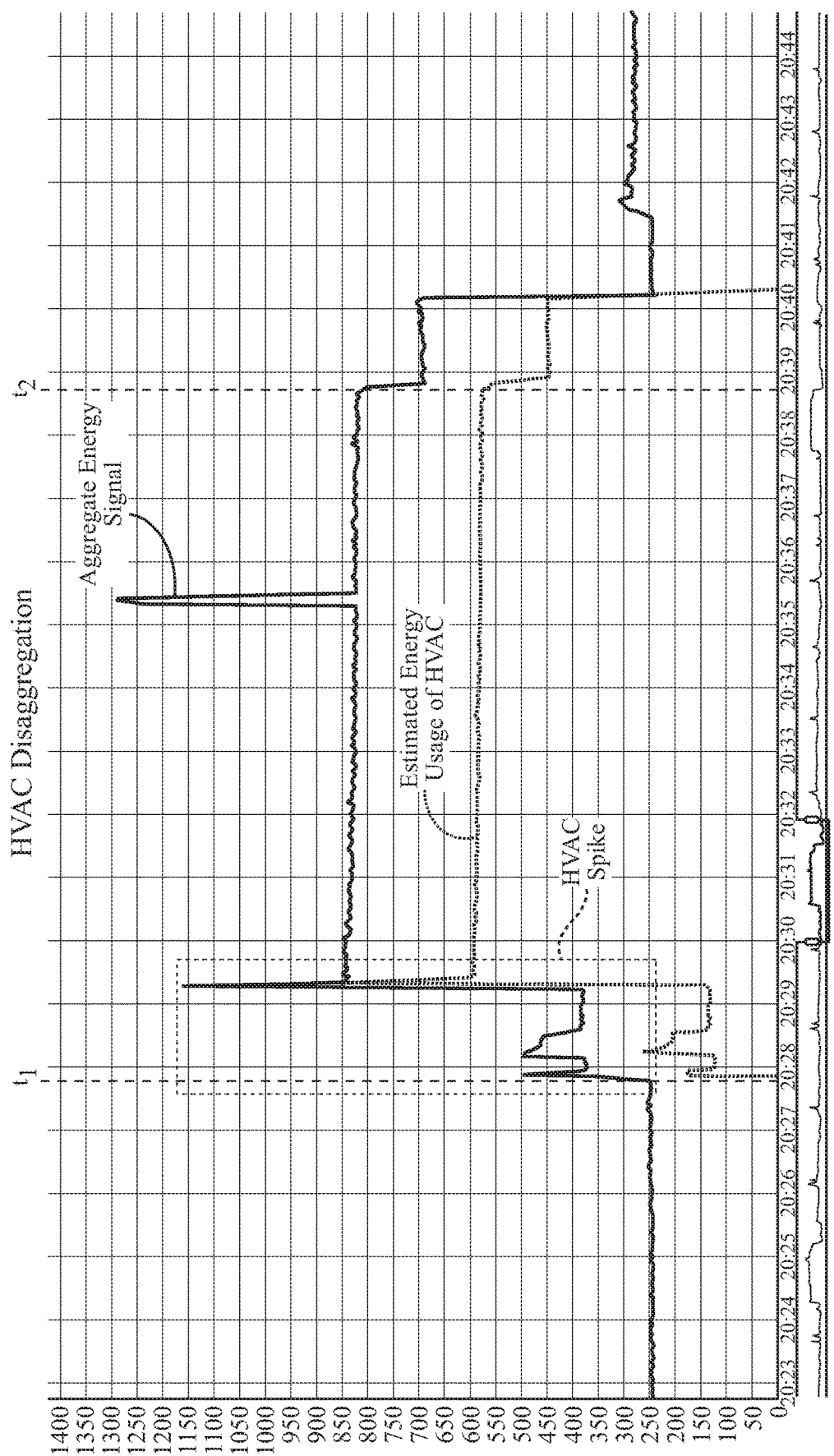
FIGS. 9A and 9B are graphical views of the aggregate energy usage signal of the usage area.
Figure 9B:
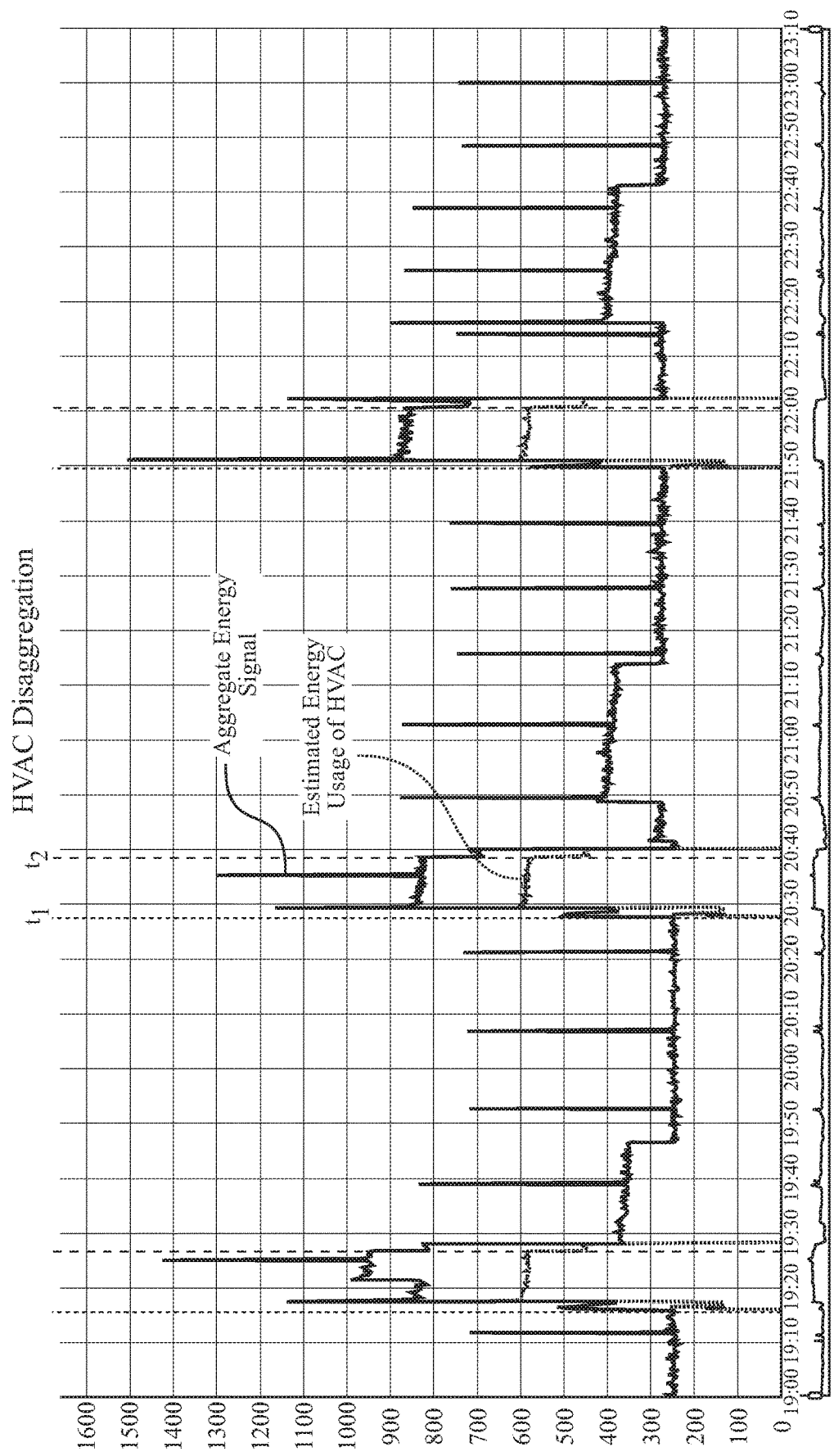

FIG. 9A and FIG. 9B provide plots of the aggregate energy usage of the usage area and an energy usage of an HVAC system of the usage area to further demonstrate step 108, the step of determining the energy usage of the electrically powered devices 36. As previously stated, the method may apply a software-based algorithm or a hardware-assisted algorithm to determine the energy usage of an electrically powered device 36 in the usage area. FIGS. 9A and 9B demonstrate a software-assisted and hardware-assisted algorithm for determining the energy usage of the HVAC system of the usage area.

Similar to a refrigerator, the HVAC system of the usage area may cycle on and off in regular intervals throughout a day. To demonstrate, FIG. 9A provides the aggregate energy usage and the estimated energy usage of HVAC system for three cycles of the HVAC system. As shown in FIG. 9A, a first cycle of the HVAC system starts at $t_1'$ and ends at $t_2'$. Similarly, a second and a third cycle of the HVAC system start at $t_1$ and $t_1''$, respectively, and end at $t_2$ and $t_2''$, respectively. To determine the energy usage of the HVAC system, the method may use a software-based algorithm or a hardware-assisted algorithm to determine cycle information of the HVAC system. To demonstrate an embodiment of the software-based algorithm and the hardware-assisted algorithm, FIG. 9B provides the aggregate energy usage and the energy usage of the HVAC system for the second cycle of the HVAC.

In an embodiment where the method uses a software-based algorithm, the method may determine the beginning and end of the cycle by analyzing the aggregate energy usage signal for quick increases of a certain amplitude or form. As shown in FIG. 9B, an increase is labelled "HVAC Spike" and represents a beginning of the cycle. Therefore, the method may analyze the aggregate energy usage signal for an increase similar to "HVAC Spike". After identifying an "HVAC Spike", the method may determine the start, $t_1$, of the HVAC cycle. The method may then determine the energy usage of the HVAC system by subtracting the energy usage prior to $t_1$ from the aggregate energy usage signal. In some embodiments, the method may similarly determine the end of the HVAC cycle or apply a previously programmed and/or predetermined time for a cycle of the HVAC system.

In an embodiment where the method uses a hardware-assisted algorithm, the method may determine the beginning and end of the cycle based on timestamp data of the HVAC system. In such an embodiment, a sensor may be coupled to the HVAC system and may provide timestamp data detailing on/off events of the HVAC system. As such, the method may determine the start, $t_1$, and end, $t_2$, of the HVAC cycle based on the on/off events. The method may then determine the energy usage of the HVAC system by subtracting the energy usage prior to $t_1$ from the aggregate energy usage signal.

Furthermore, the method may incorporate any of the previously described plurality of inputs to determine the energy usage of the electrically powered devices 36. For example, in one embodiment, the method may incorporate cycle information of a fridge of the usage area while determining the energy usage of the HVAC system. As shown in FIG. 9B, the aggregate energy usage includes a "Fridge Spike", which represents a cycle of a refrigerator of the usage area and an associated increase in the aggregate energy usage. Referring to the plot of the energy usage of the HVAC system in FIG. 9B, the method omits this increase in the aggregate energy usage when determining the energy usage of the HVAC system. Because the method has already attributed the increase in the aggregate energy usage to the refrigerator, the method may omit the increase when calculating the energy usage of the HVAC system.

The method, in other embodiments, may incorporate other information received from the plurality of inputs to determine the energy usage of the electrically powered devices 36. For example, the method may determine an energy usage of a coffee machine based on crowd-sourced energy usage information, which may provide an estimated energy usage of an average in-home coffee machine. As another example, the method may determine the energy usage of a desktop computer based on energy usage information provided by a plug-in module coupled to the desktop computer.

Additionally, the algorithms used by the method may be learning algorithms. As such, the algorithms may analyze past behavior of the electrically powered devices 36 to more accurately determine the energy usage of the electrically powered devices 36. For example, the learning algorithm may estimate a median energy usage of an electrically powered device 36 at each second after an on event is reported by the timestamp data of on/off events. In some embodiments, this may be referred to as a learning period of the learning algorithm. After the median energy usage begins to stabilize or after a predetermined amount of time has passed, the method may store the median energy usage as an estimated energy usage of the electrically powered device 36. In another embodiment, the method may analyze past behavior of the electrically powered devices 36 to determine cycle information of the electrically powered devices 36. For example, the method may infer the start or end of a refrigerator cycle or HVAC cycle based on past behavior of the refrigerator or HVAC system. As such, the method may determine energy usage patterns for the electrically powered devices 36 and may create a database for storing the energy usage patterns of the electrically powered devices 36.

Furthermore, the method may determine the baseline load of the usage area. In one embodiment, the method may determine the baseline load of the usage area by subtracting the energy usage of the electrically powered devices 36 from the aggregate energy usage signal. In another embodiment, the method may determine the baseline load of the usage area by determining the energy usage of electrically powered devices 36, which contribute to the baseline load of the usage area.

The method may also include a step of communicating the energy usage of the electrically powered devices 36 to the user 34. In one such embodiment, the method may display the energy usage to the user 34 via the user application 50. Furthermore, as previously stated, the gateway device 40 may receive the aggregate energy usage signal at a high frequency, at a predetermined time interval (e.g., at a time interval less than 30 minutes, at a time interval less than 20 minutes, etc.), or as a substantially continuous signal to determine the energy usage. Similarly, the method may determine and display the energy usage to the user 34 at a high frequency, at a predetermined time interval, (e.g., at a time interval less than 20 minutes, at a time interval less than 10 minutes, etc.), or continuously.

V. Intelligent Demand Response System Overview

Figure 10A:
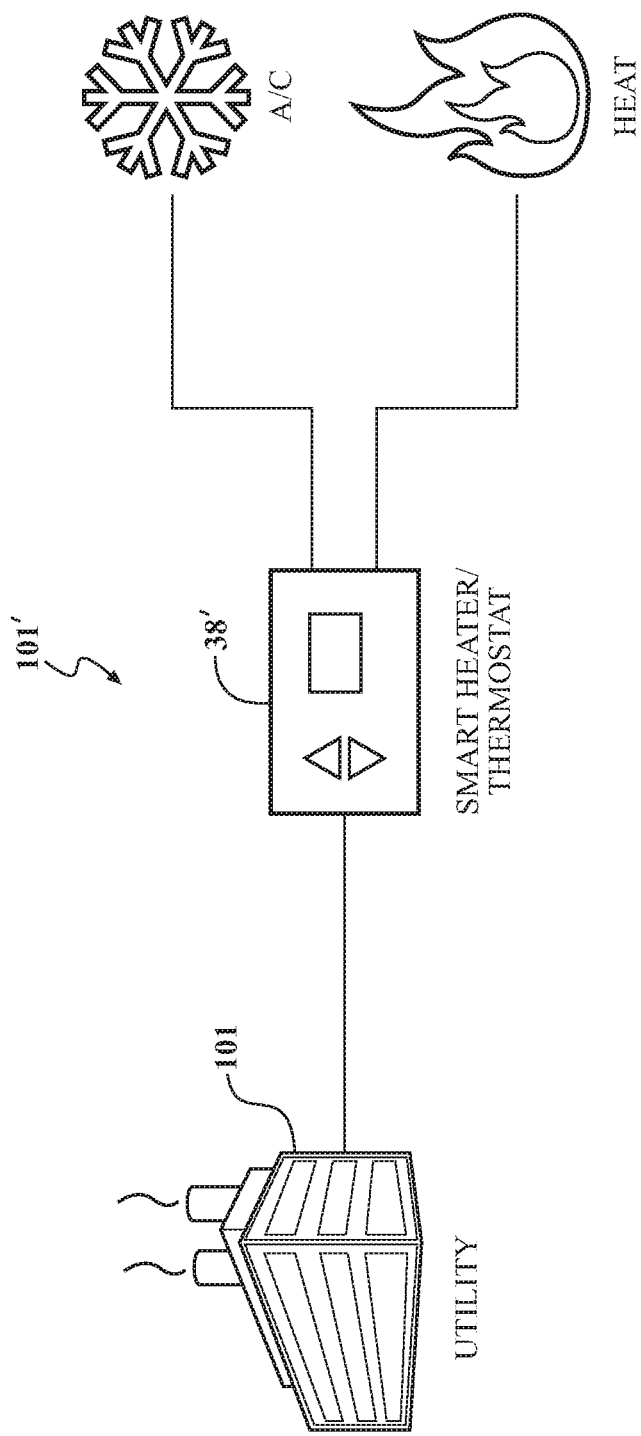
FIG. 10A is a diagrammatic view of a system of demand response known in the prior art.
Figure 10B:
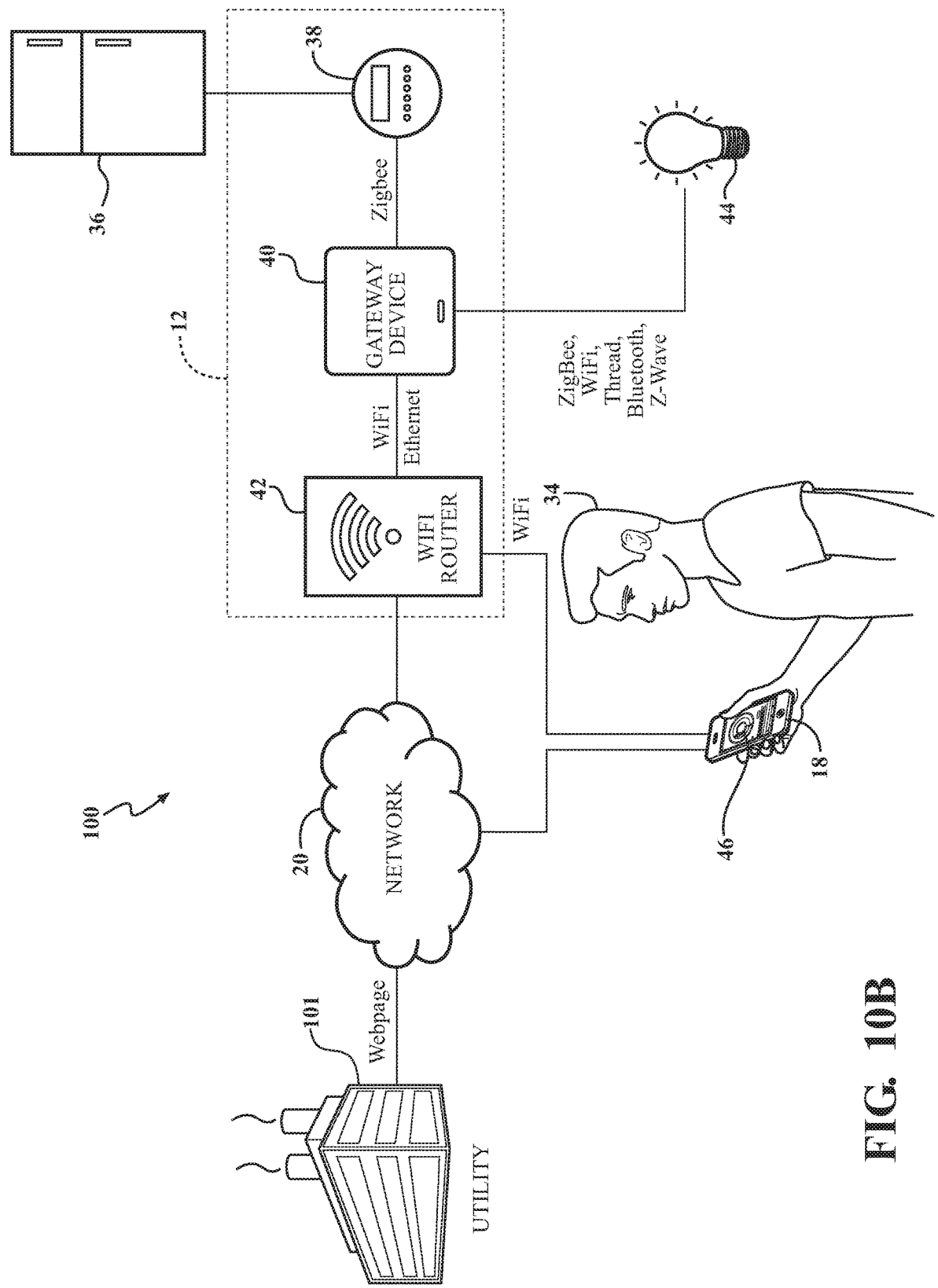

Referring to the figures, wherein like numerals indicate like or corresponding parts throughout the several views, a system for adjusting the energy usage of the usage area, referred to herein as an intelligent demand response system 100, is provided in FIGS. 10B and 10C. The intelligent demand response system 100 may include the previously described energy usage platform 12 (shown in FIG. 1), the previously described electrically powered devices 36 (shown in FIG. 1), the previously described IoT devices 44 (shown in FIG. 5), and an energy provider 101. It should be appreciated that the intelligent demand response system 100 may allow the energy provider 101 to monitor and control the energy usage of at least one electrically powered device 36 in the usage area, and thus adjust the energy usage of the usage area.

For example, the energy provider 101 may monitor and control the energy usage of the at least one electrically powered device 36 in the usage area during a demand response event. Demand response events, as referred to herein, correspond to a demand by the energy provider 101 to reduce an energy usage of a plurality of usage areas during times of peak demand. To this end, energy providers 82 may monitor and control the energy usage of the plurality of usage areas by monitoring and controlling the at least one electrically powered devices 36 in the plurality of usage areas.

Referring to FIG. 10B, it should be noted that the intelligent demand response system 100 may include the previously described network 20 (shown in FIG. 2), as well as the previously described user computing device 18 (shown in FIG. 3). Furthermore, because the intelligent demand response system 100 may include the previously described energy usage platform 12, it is to be noted that the intelligent demand response system 100 may also include the previously described WiFi router 42, gateway device 40, and energy measurement devices 38.

In the embodiment of the intelligent demand response system 100 shown in FIG. 10B, the energy provider 101 may monitor and control the energy usage of at least one electrically powered device 36. To accomplish this, the intelligent demand response system 100 may include the previously described energy usage platform 12 to determine the energy usage of the at least one electrically powered device 36. Additionally, the intelligent demand response system 100 may create a user energy profile 46 to store various energy related preferences. In the embodiment shown in FIG. 10B, the user energy profile 46 may be created using the previously described user application 50 on the user computing device 18. As such, the intelligent demand response system 100 may allow the energy provider 101 to monitor the energy usage of the at least one electrically powered device 36 determined by the energy usage platform as well as the user energy profile 46. Accordingly, the energy provider 101 may control the energy usage of the at least one electrically powered device 36 using the network 20 and the energy usage platform 12 and based on the energy usage of the at least one electrically powered device 36 and the user energy profile 46. Additionally, in some embodiments, the user 34 may be notified on their user computing device 18 via the user application 50 when the energy provider 101 controls the at least one electrically powered device 36.

Furthermore, it should be noted that the energy usage platform, as previously discussed, may connect to multiple electrically powered devices 36 and to multiple energy measurement devices 38 via the gateway device 40. As previously stated, the gateway device 40 may control the plurality of electrically powered devices 40 and/or be structurally separate from the plurality of electrically powered devices 40. Further, in a typical embodiment, the gateway device 40 may determine an energy usage of an electrically powered device 40 of the usage area using the above-described method of disaggregating the aggregate energy usage signal of the usage area. As such, the energy usage platform may monitor and control an energy usage of multiple electrically powered devices 36 via the gateway device 40. Additionally, in some embodiments, the energy provider 101 may adjust the energy usage of the multiple electrically powered devices 36 in the usage area based on the energy usage of the multiple electrically powered devices 36 in the usage area.

In a more specific embodiment of the intelligent demand response system 100, the energy provider 101 may monitor and control an energy usage of at least one IoT device 44. It should again be understood that IoT devices 44 are a subset of the electrically powered devices 36. The IoT devices may be connected to the gateway device 40 using one of WiFi, ZigBee Smart Energy Profile, Bluetooth, Thread, or Z-Wave as the communication protocol. As such, the energy provider 101 may monitor and control the energy usage of the IoT device 44 using the network 20 and energy usage platform 12. Additionally, the user 34 may be notified via the user application 50 of the user computing device 18 when the energy provider 101 controls the at least one IoT device 44. Also, as previously shown in FIG. 6, the energy usage platform 12 is able to connect to multiple IoT devices 44 and, therefore, monitor and control an energy usage of multiple IoT devices 44.

Additionally, FIG. 10C shows an embodiment of the intelligent demand response system 100 where the energy provider 101 is able to connect to multiple energy usage platforms 12 in multiple usage areas. As previously stated, the gateway device 40 may control the plurality of electrically powered devices 40 and/or be structurally separate from the plurality of electrically powered devices 40. Further, in a typical embodiment, the gateway device 40 may determine an energy usage of an electrically powered device 40 of the usage area using the above-described method of disaggregating the aggregate energy usage signal of the usage area. As follows, the energy provider 101 may control multiple electrically powered devices 36 in multiple usage areas. Furthermore, in some embodiments, the energy provider 101 may adjust the energy usage of the multiple electrically powered devices 36 in the multiple usage areas based on the energy usage of the multiple electrically powered devices 36 in the multiple usage areas.

To aid in understanding advantages of the intelligent demand response system 100', FIG. 10A provides a schematic diagram, illustrating a known demand response system 100'. In the known demand response system 100', the energy provider 101 may be connected to an energy measurement device 38', which is illustrated as a smart energy meter. The energy measurement device 38' may be connected to an HVAC system, illustrated using the "A/C" and "Heat" icons. The energy measurement device 38' may also be connected to any other device proprietary to the energy provider 101. For example, some energy providers offer rebated refrigerators and/or LED lighting, which may be controlled by the energy measurement device 38'. As such, during times of peak demand, the energy provider 101 may control the HVAC system or the devices proprietary to the energy provider 101 to eliminate unnecessary energy usage.

It may be readily noted that the demand response system 100' in FIG. 10A does not include the gateway device 40 and is, therefore, only capable of controlling the HVAC system or the devices proprietary to the energy provider 101 in a usage area. In contrast, the intelligent demand response system 100 in FIG. 10B may control a plurality of electrically powered devices 36 using the gateway device 40. As previously stated, the gateway device 40 may control the plurality of electrically powered devices 40 and/or be structurally separate from the plurality of electrically powered devices 40. Further, in a typical embodiment, the gateway device 40 may determine an energy usage of an electrically powered device 40 of the usage area using the above-described method of disaggregating the aggregate energy usage signal of the usage area. As such, the energy provider 101 may control the at least one electrically powered devices 36 based on an energy usage of the at least one electrically powered devices 36.

VI. Method of Adjusting the Energy Usage of a Usage Area

Figure 11:
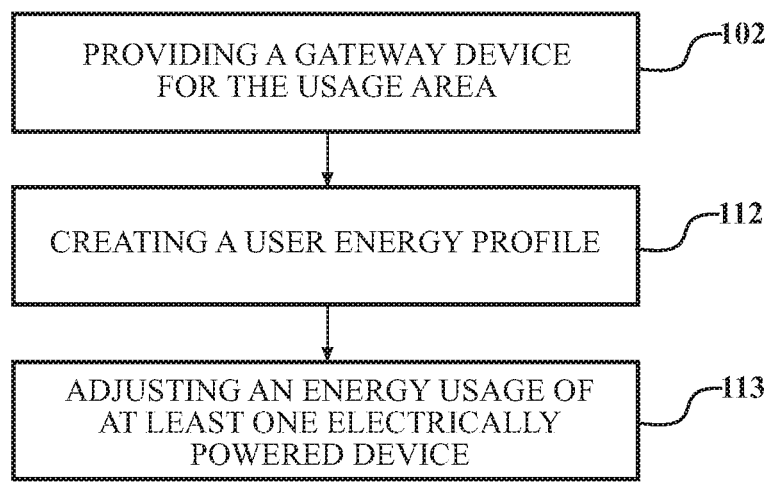
FIG. 11 is a flowchart of a method, according to the present invention, of adjusting an energy usage of a usage area using the system of FIGS. 10B and 10C.

In accordance with the components described above, a method of adjusting the energy usage of a usage area, referred to herein as a method of intelligent demand response, is provided in FIG. 11. The method of intelligent demand response allows control of at least one electrically powered device 36 in the usage area via the gateway device 40. In this way, the method of intelligent demand response may adjust the energy usage of the usage area.

Furthermore, it should be noted that the method of intelligent demand response may be referred to in this section (Section VI) as "the method". Therefore, unless otherwise specified, any references to "the method" in this section refer to the method of intelligent demand response and are not to be confused with the method of disaggregating the energy usage signal of the usage area (previously described in Section IV).

As illustrated, the method may include a step 102 of providing the gateway device 40 for the usage area, wherein the usage area includes the at least one electrically powered device 36; a step 112 of creating a user energy profile 46; and a step 113 of adjusting the energy usage of the at least one electrically powered device 36 using the gateway device 40 and based on the user energy profile 46. In an example embodiment, if the user 34 has opted-in to demand response events, according to the user energy profile 46, the energy provider 101 may adjust the energy usage of an HVAC system of the user's 34 home during a demand response event using the gateway device 40.

The method, in some embodiments, may also include a step of connecting the gateway device 40 to a server, such as the server system 14, and providing the energy provider 101 access to the server. The method may also include the previously described step 104 (shown in FIG. 8) of installing the user application 50 on the user computing device 18 to display information from the gateway device 40. It should be appreciated that the gateway device 40, the user application 50, and the server may have been previously provided or installed and may be installed in any order.

Additionally, the method may include the previously described step 108 (shown in FIG. 8) of determining the energy usage of the electrically powered devices 36 in the usage area based on the aggregate energy usage signal and based on the plurality of demand response inputs. The method may also include the previously described step 106 (shown in FIG. 8) of receiving the plurality of demand response inputs to determine the energy usage of the electrically powered devices 36 in the usage area. As such, it should be noted that the method of intelligent demand response may perform steps from the previously described method of disaggregating the aggregate energy usage signal to determine the energy usage of the at least one electrically powered device 36. In some embodiments, the method may also include the previously described step of communicating the energy usage to the user 34.

As previously stated, the method may include the step 112 of creating the user energy profile 46. For example, in one embodiment, the user energy profile 46 may specify that the user 34 prefers all lights in his or her home to be shut off during a weekday. Furthermore, in embodiments including step 108 and the step of creating the user energy profile 46, the step 113 may adjust the energy usage of the at least one electrically powered device 36 based on the energy usage of the at least one electrically powered device 36 and based on the user energy profile 46. For example, the method may allow the energy provider 101 to turn off a light of the usage area if the energy provider 101 determines, based on the energy usage of the light, that the light is turned on during a weekday.

In some embodiments, the user energy profile 46 may be created by the user 34 via the user application 50. In other embodiments, the user energy profile 46 may be created by the energy provider 101. In still other embodiments, the user energy profile 46 may be automatically created after the user application 50 is installed.

In some embodiments, the user energy profile 46 may include input provided by the user, input provided by the energy provider 101, input based on the energy usage of any usage area, and/or input provided by a person other than the user 34. For example, the method may query the user 34 or the energy provider 101 for the input for the user energy profile 46. The method may also receive the input from the user application 50, a webpage, and/or the server. Furthermore, the input may be based on the energy usage in any usage area. For example, the user energy profile may include crowd-sourced energy usage information from a person other than the user 34 and from a usage area other than the usage area of the user 34. In another example, the user energy profile may include energy usage information from the usage area of the user 34.

Figure 12:
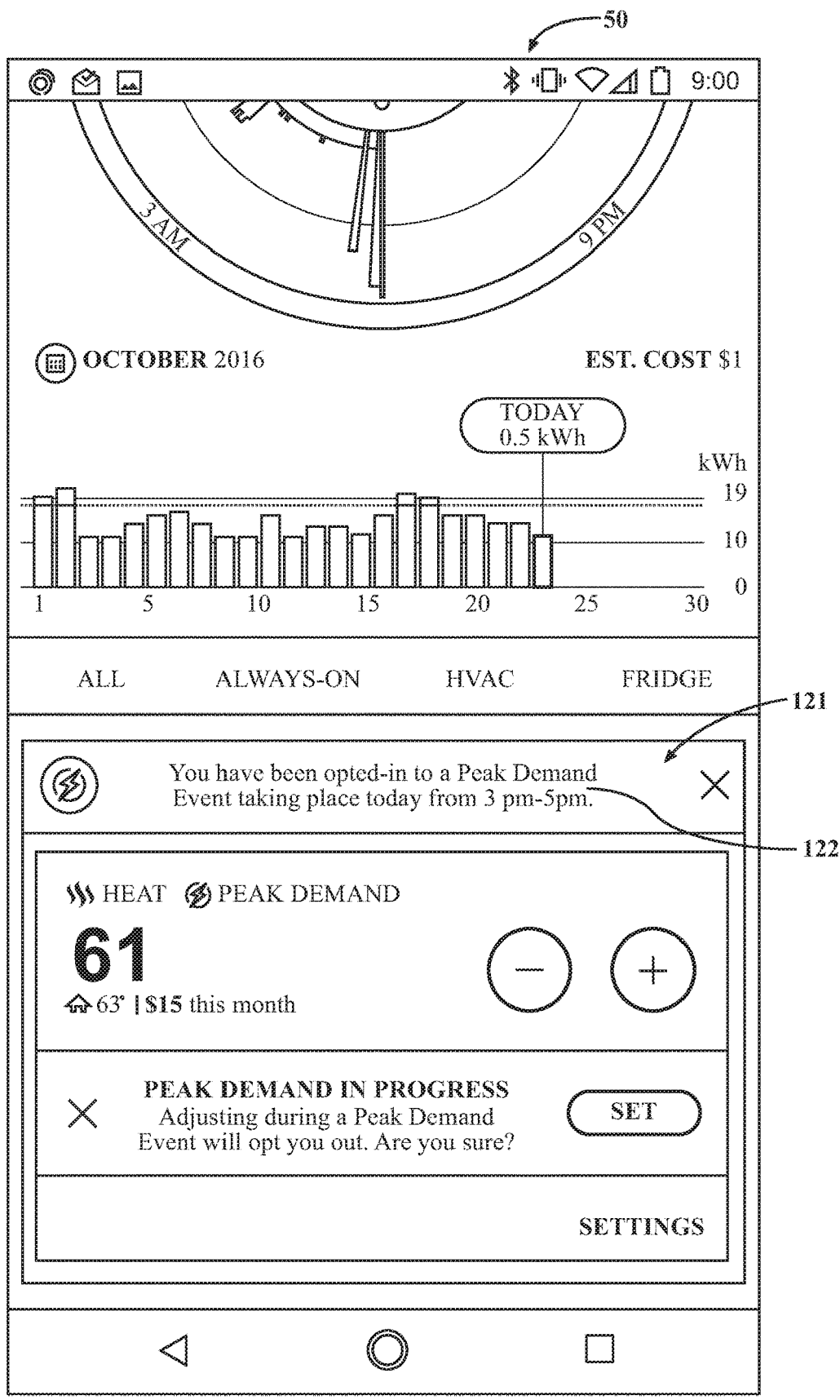
FIG. 12 is a view of the user application used in conjunction with the system of FIGS. 10B and 10C.

Furthermore, the user energy profile 46 may include a demand response preference of the user energy profile 46. The demand response preference of the user energy profile 46 may include a preference to opt-in or opt-out of demand response events. In some embodiments, this preference may be obtained by querying the user 34. In other embodiments, the demand response preference may be automatically set to the opt-in preference and may be changed by the user 34. For example, FIG. 12 illustrates a view of the user application 50 where the user application 50 provides the demand response preference 122 of the user energy profile 46. As shown in FIG. 12, the demand response preference 122 specifies that the user 34 has opted-in to demand response events.

The user energy profile 46 may also include an occupancy of the usage area. In some embodiments, the occupancy of the usage area may be determined by obtaining location information of one or more occupants and determining whether the one or more occupants are in the usage area. In another embodiment, the method may determine the location information of the one or more occupants by evaluating energy usage information of the electrically powered devices 36 for patterns indicative of "home" or "away" occupants. For example, in an embodiment where the at least one electrically powered device 36 is a motion sensor light, the method may determine the location information of the occupants of the usage area based on energy usage information of the motion sensor light. Furthermore, the method may determine the occupancy of the usage area based on location information of the user computing device 18. For example, in one embodiment, the location information may be obtained by using the previously described GPS 30 of the user computing device 18. In another embodiment, the method may determine the occupancy of the usage area by querying the user 34 for location information via the user application 50. As such, the user 34 may designate whether they are "home" or "away" using the user application 50. Additionally, the method may determine the occupancy of the usage area based on information from a security system or alarm system of the usage area. For example, the method may determine the occupancy of the usage area based on whether the security system is armed, set to an "away" mode, or set to a "home" mode.

The user energy profile 46 may also include an energy savings preference. The energy savings preference may include a preferred energy savings for the entire usage area or for the at least one electrically powered device 36. For example, the energy savings preference may specify a certain dollar amount or a certain amount of Watts (W) per month that the user 34 would like to save. In another example, the energy savings preference may include a preference for aggressive energy savings or conservative energy savings. For example, if the user 34 opts for the aggressive energy savings, the user 34 may be more likely to participate in demand response events than if the user 34 opts for the conservative energy savings.

The user energy profile 46 may also include an energy usage preference for the at least one electrically powered device 36. The energy usage preference may specify a preferred energy usage for the entire energy usage area or for the at least one electrically powered device 36. For example, the energy usage preference may specify a certain amount of Watts (W) per month that the user 34 has allotted for the entire usage area or for the at least one electrically powered device 36.

In some embodiments, the energy usage preference of the user energy profile 46 may depend on a plurality of demand response inputs. The plurality of demand response inputs may include at least one of the occupancy of the usage area, time, a preference of the user 34, and the environment-related metadata. For example, the energy usage preference for the at least one electrically powered device 36 may differ if the method determines that the user 34 is in the usage area or away from the usage area, based on the occupancy of the usage area. For example, if the method determines that the user 34 is away from the usage area, the energy usage preference may specify that the outdoor lights of the usage area be left on and that the indoor lights of the usage area be left off. In another example, if the method determines that the user 34 is in the usage area, the energy usage preference may allow a television of the usage area to be left on indefinitely. If the method determines that the user 34 is away from the usage area, the energy usage preference may specify that the television of the usage area be turned off after 30 minutes.

Furthermore, the energy usage preference for an electrically powered device 36 may depend on time and/or the environment-related metadata. For example, if the method determines that it is a sunny day, the energy usage preference may specify that all lights in the usage area be turned off. If the method determines that it is a relatively cool day, the energy usage preference may specify that all ceiling fans be turned off. In another embodiment, the energy usage preference may designate a "low", "medium", or "high" energy usage allowed for the at least one electrically powered device 36. In a further embodiment, the user 34 may rank the at least one electrically powered devices 36 by their energy usage preference using the user application 50.

The user energy profile 46 may also include a temperature preference. The temperature preference may include a temperature setting for an HVAC system of the usage area. The temperature preference may also specify a temperature setting for the usage area or a temperature setting for any electrically powered device 36 with a temperature input. For reference, an electrically powered device 36 with a temperature input may be a refrigerator, a freezer, a humidifier, etc. The temperature preference may depend on a plurality of demand response inputs, the plurality of demand response inputs comprising at least one of the occupancy of the usage area, time, the environment-related metadata, the energy savings preference, and the energy usage preference. For example, if the method determines that the usage area is unoccupied, based on the occupancy of the usage area, the temperature preference may specify that the HVAC system be turned off. In some embodiments, the temperature preference may be provided by the user 34 and/or the energy provider 101.

The method may also include a step of sharing demand response information. For example, the demand response information may include at least one of an estimate of a potential total energy saved, an actual total energy saved, a notification of a demand response event, a notification of the energy usage for the at least one electrically powered device 36, a notification of a temperature in the usage area, and a notification of the occupancy of the usage area. The demand response information may be shared with the user 34 or the energy provider 101. As such, the energy provider 101 and/or the user 34 may view the demand response information prior to and after a demand response event and the user 34 may be notified of the demand response event. In some embodiments, the demand response information may be accessed via the server and/or the user application 50. For example, as shown in FIG. 12, the user application 50 may provide the notification of the demand response event 121 to the user 34.

As previously stated, the method may include the step 113 of adjusting the energy usage of the at least one electrically powered device 36 in the usage area. In embodiments where the method includes the steps of connecting the gateway device 40 to the server and providing the energy provider 101 access to the server, the energy provider 101 may perform step 113. In a further embodiment, the method may also include a step of uploading the user energy profile 46 and the energy usage of the at least one electrically powered device 36 in the usage area to the server. Accordingly, the energy provider 101 may access the user energy profile 46 and the energy usage of the at least one electrically powered device 36 in the usage area via the server. Additionally, the method may include a step of determining the at least one electrically powered device 36 to control during a demand response event based on the user energy profile 46 and the energy usage of the at least one electrically powered device 36 in the usage area. Furthermore, the method may further include a step of allowing the energy provider 101 to control the at least one electrically powered device 36 in the usage area during a demand response event in response to determining the at least one electrically powered device 36 to control.

The step of determining the at least one electrically powered device 36 to control includes all determinations related to controlling the energy usage of the at least one electrically powered device 36, such as prioritizations and scheduling. For example, if the energy usage of more than one electrically powered device 36 may be controlled, the method may determine which electrically powered devices 36 hold a higher relative priority and may be controlled first. Furthermore, if the energy usage of electrically powered devices 36 in more than one usage area may be controlled, the method may determine which usage areas hold a higher relative priority when determining which electrically powered devices 36 may be controlled first. In one embodiment, the electrically powered device 36 may be prioritized based on which electrically powered devices 36 will have a minimal impact on an occupant of a usage area. For example, during a demand response event, the method may determine that an electrically powered device 36 of an unoccupied usage area may be controlled before an electrically powered device 36 of an occupied usage area.

In another embodiment, the method may prioritize which electrically powered devices 36 to control based on which electrically powered devices 36 will shed the largest load when controlled. For example, the at least one electrically powered device 36 in a usage area may be controlled based on the user energy profile 46, energy usage information of an electrically powered device 36 of the usage area, the occupancy of the usage area, the attribute data of the usage area, temperature information of the usage area, time, and/or the environment-related metadata. For example, during a demand response event, if the method determines that the ambient outdoor temperature is 90° F. based on the environmental metadata, a thermostat in a usage area set to 65° F. may be controlled and shut off by the energy provider 101 before a thermostat in a usage area set to 75° F.

In one embodiment, the method may schedule the at least one electrically powered device 36 to control. In such an embodiment, the method may schedule the at least one electrically powered devices 36 to control based on the user energy profile 46, time, energy usage information of an electrically powered device 36 of the usage area, the occupancy of the usage area, the attribute data of the usage area, temperature information of the usage area, time, and/or the environment-related metadata. For example, the method may schedule the HVAC system of the usage area to be controlled by the energy provider 101 for two hours between 9 AM and 5 PM every weekday.

It should be noted that, in some embodiments, the various prioritizations and schedules may themselves be prioritized. For example, during a demand response event, the method may first determine which electrically powered device 36 to control based on an occupancy of multiple usage areas. In such an embodiment, the method may then determine which electrically powered devices 36 to control based on which electrically powered devices will shed the largest load when controlled.

Furthermore, during step 113, the method may adjust the energy usage of the at least one electrically powered device 36 in a number of ways. For example, the energy provider 101 may choose to turn the at least one electrically powered device 36 completely on or completely off. In embodiments where the at least one electrically powered device 36 accepts a continuous input, the energy provider 101 may adjust the continuous input to a value between completely on or completely off, inclusive. Furthermore, if the at least one electrically powered device 36 accepts a specific input, such as a temperature setting or a time setting, the electrically powered device 36 may adjust this value accordingly. Additionally, the method may adjust the energy usage of the at least one electrically powered device 36 directly or indirectly. For example, in one embodiment, the energy provider 101 may indirectly adjust an energy usage of an HVAC system of the usage area by adjusting a temperature set point of the HVAC system. In another embodiment, the energy provider 101 may directly adjust the energy usage of a light of the usage area by turning the light on or off.

Furthermore, it should be appreciated that the user energy profile 46 described above may comprise a plurality of user energy profiles 46 and the usage area described above may comprise a plurality of usage areas. Therefore, in one embodiment, the method may determine the at least one electrically powered device 36 in a usage area of the plurality of usage areas to control during a demand response event based to the plurality of user energy profiles 46 and the energy usage of the at least one electrically powered device 36.

Several embodiments have been discussed in the foregoing description. However, the embodiments discussed herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

What is claimed is:

1. A method of adjusting an energy usage of a usage area, the method comprising steps of:
   providing a gateway device for receiving an aggregate energy usage signal of the usage area wherein the usage area comprises at least one electrically powered device;
   installing a user application on a user computing device for communicating with the gateway device, the user computing device being a mobile device;
   creating a user energy profile using the user application on the user computing device;
   adjusting an energy usage of the at least one electrically powered device in the usage area using the gateway device and based on the user energy profile;
   the user energy profile comprising a demand response preference, an occupancy of the usage area, an energy usage preference, and an energy savings preference;
   wherein the demand response preference comprises a preference to opt-in and opt-out of demand response events;
   wherein the occupancy of the usage area is determined by obtaining location information of at least one occupant and determining whether the at least one occupant is in the usage area; and
   wherein the energy savings preference comprises a preferred energy savings and an aggressive energy savings and conservative energy savings.

2. The method as set forth in claim 1, wherein the gateway device is structurally separate from the at least one electrically powered device and the gateway device may connect to a plurality of electrically powered devices.

3. The method as set forth in claim 1, further including the step of measuring the aggregate energy usage of the usage area with the gateway device and determining the energy usage of the at least one electrically powered device with the gateway device based on the aggregate energy usage.

4. The method as set forth in claim 1, wherein the step of adjusting comprises adjusting the energy usage of the at least one electrically powered device in the usage area based on the energy usage of the at least one electrically powered device.

5. The method as set forth in claim 1, wherein the user energy profile includes at least one of input provided by a user, input based on energy usage in a usage area, input provided by an energy provider, input provided via a server, and input provided by a person other than the user and wherein the user energy profile further comprises a temperature preference.

6. The method as set forth in claim 5, wherein the energy usage preference is based on a plurality of demand response inputs, the plurality of demand response inputs comprising at least one of the occupancy of the usage area, time, preference of the user, environment-related metadata, and the energy savings preference.

7. The method as set forth in claim 5, wherein the temperature preference comprises at least one of a temperature setting for the usage area, a temperature setting for an HVAC system, and a temperature setting for the at least one electrically powered device, and wherein the temperature preference is based on a plurality of demand response inputs, the plurality of demand response inputs comprising at least one of the occupancy of the usage area, time, environment-related metadata, the energy savings preference, and the energy usage preference.

8. The method as set forth in claim 5, wherein the method further comprises a step of sharing demand response information, and wherein the demand response information comprises at least one of an estimate of a potential total energy saved, an actual total energy saved, a notification of a demand response event, a notification of the energy usage for the at least one electrically powered device, a notification of a temperature in the usage area, and a notification of the occupancy of the usage area.

9. The method as set forth in claim 8, wherein the step of providing a gateway device further comprises the step of connecting the gateway device to the server and providing an energy provider access to the server.

10. The method as set forth in claim 9, wherein the step of adjusting further comprises steps of:
uploading the user energy profile and the energy usage of the at least one electrically powered device in the usage area to the server;
determining the energy usage of the at least one electrically powered device and determining the at least one electrically powered device in the usage area to control during a demand response event based on the user energy profile, wherein the step of determining comprises at least one of the step of prioritizing the control of the at least one electrically powered device in the usage area and the step of scheduling the control of the at least one electrically powered device in the usage area; and
allowing the energy provider to control the at least one electrically powered device in the usage area during a demand response event based on the determination.

11. The method as set forth in claim 1, wherein the usage area comprises a plurality of usage areas, the user energy profile comprises a plurality of user energy profiles, and the step of adjusting comprises a step of determining the at least one electrically powered device in the plurality of usage areas to control during a demand response event with the plurality of user energy profiles, and adjusting the energy usage of the at least one electrically powered device based on the plurality of user energy profiles.

12. The method as set forth in claim 11, wherein the step of determining the energy usage comprises a step of determining a baseline load of the usage area based on determining the energy usage of the at least one electrically powered device in the usage area, and capturing an aggregate energy usage in watts at a predetermined interval, and wherein the predetermined interval is less than ten seconds.

13. The method as set forth in claim 11, wherein the step of determining the energy usage further comprises the step of receiving a plurality of inputs with either one of the gateway device and the user application.

14. The method as set forth in claim 13, wherein the plurality of inputs comprises attribute data of the usage area and wherein the attribute data of the usage area comprises a number of individuals living in the usage area, a year built of the usage area, and a square footage of the usage area.

15. The method as set forth in claim 13, wherein the plurality of inputs comprises environment-related metadata.

16. The method as set forth in claim 15, wherein the environment-related metadata comprises weather-related data and wherein the weather-related data comprises measurements of at least one of temperature, precipitation, humidity, and barometric pressure.

17. The method as set forth in claim 13, wherein the step of receiving the plurality of inputs comprises the step of either one of receiving a state of the usage area and a state of the at least one of electrically powered device from smart devices in the usage area and wherein the smart devices comprise at least one of a thermostat that provides temperature information, a plug-in module that provides energy usage information of the at least one electrically powered device, and sensors coupled to the at least one electrically powered device that detect and report on/off events of the at least one electrically powered device.

18. The method as set forth in claim 13, wherein the step of receiving the plurality of inputs comprises the step of receiving crowd-sourced energy usage information corresponding to the at least one electrically powered device and wherein the step of receiving crowd-sourced energy usage information corresponding to the at least one electrically powered device comprises the step of storing the crowd-sourced energy usage information and assigning the crowd-sourced energy usage information to the at least one electrically powered device.

* * * * *